(12) United States Patent
Zou

(10) Patent No.: US 12,174,227 B2
(45) Date of Patent: Dec. 24, 2024

(54) MEASURING VOLTAGE LEVEL OF A VOLTAGE NODE UTILIZING A MEASUREMENT INTEGRATED CIRCUIT

(71) Applicant: Microchip Technology Incorporated, Chandler, AZ (US)

(72) Inventor: Lei Zou, Langhus (NO)

(73) Assignee: Microchip Technology Incorporated, Chandler, AZ (US)

( * ) Notice: Subject to any disclaimer, the term of this patent is extended or adjusted under 35 U.S.C. 154(b) by 166 days.

(21) Appl. No.: 17/653,062

(22) Filed: Mar. 1, 2022

(65) Prior Publication Data

US 2022/0317164 A1  Oct. 6, 2022

Related U.S. Application Data

(60) Provisional application No. 63/200,837, filed on Mar. 31, 2021.

(51) Int. Cl.
   *G01R 19/25*   (2006.01)
   *G01R 15/16*   (2006.01)
   *H03M 1/38*    (2006.01)

(52) U.S. Cl.
   CPC ............. *G01R 19/25* (2013.01); *G01R 15/16* (2013.01); *H03M 1/38* (2013.01)

(58) Field of Classification Search
   CPC .... G01R 19/25; G01R 15/16; G01R 19/2506; G01R 15/06; G01R 31/2879; G01R 31/28; G01R 31/006; G01R 31/00; H03M 1/38
   See application file for complete search history.

(56) References Cited

U.S. PATENT DOCUMENTS

| | | | |
|---|---|---|---|
| 11,714,107 B2 * | 8/2023 | Matsuno | G01R 15/06 324/126 |
| 2008/0309317 A1 * | 12/2008 | Chen | H01M 10/425 324/72 |

(Continued)

FOREIGN PATENT DOCUMENTS

| | | |
|---|---|---|
| EP | 2993480 A1 | 3/2016 |
| WO | 2008/052495 A1 | 5/2008 |
| WO | 2012/069307 A1 | 5/2012 |

OTHER PUBLICATIONS

Zou, "A 9-bit successive approximation ADC in SOI CMOS operating up to 300°C", International Journal of Circuit Theory and Applications (2015), 10 pages.

(Continued)

*Primary Examiner* — Son T Le
(74) *Attorney, Agent, or Firm* — TraskBritt

(57) ABSTRACT

One or more examples relate to methods and apparatuses for measuring a voltage node. An example method may include providing, between an input of a measurement circuit and a voltage node associated with a higher voltage domain than the measurement circuit, a circuit including decoupled capacitors, the decoupled capacitors including at least a first capacitor and a second capacitor; generating, by the measurement circuit, a first digital value representing a voltage level related to a voltage level at the voltage node at least partially responsive to performing a measurement process utilizing the circuit; and generating, by a processor, a second digital value representing the voltage level at the voltage node at least partially responsive to the first digital value and a scaling factor, the scaling factor representing a pre-specified relationship between the voltage level represented by the first digital value and the voltage level at the voltage node.

19 Claims, 13 Drawing Sheets

(56) References Cited

U.S. PATENT DOCUMENTS

| | | |
|---|---|---|
| 2011/0279108 A1 | 11/2011 | Barnett et al. |
| 2015/0112621 A1 | 4/2015 | Matsumoto et al. |
| 2017/0227582 A1* | 8/2017 | Iida .................... G01R 19/175 |
| 2018/0284178 A1* | 10/2018 | Brychta ................ G01R 31/54 |
| 2019/0081601 A1 | 3/2019 | Hurwitz et al. |

OTHER PUBLICATIONS

International Search Report for International Application No. PCT/US2022/070900, mailed Aug. 11, 2022, 7 pages.

International Written Opinion for International Application No. PCT/US2022/070900, mailed Aug. 11, 2022, 9 pages.

\* cited by examiner ature. However, other examples
MEASURING VOLTAGE LEVEL OF A VOLTAGE NODE UTILIZING A MEASUREMENT INTEGRATED CIRCUIT

CROSS-REFERENCE TO RELATED APPLICATION

This application claims the benefit under 35 U.S.C. § 119(e) of U.S. Provisional Patent Application Ser. No. 63/200,837, filed Mar. 31, 2021, for, "ON CHIP MEASUREMENT OF HIGH VOLTAGE NODE WITH LOW VOLTAGE MEASUREMENT CIRCUIT AND RELATED SYSTEMS, METHODS AND DEVICES," the content and disclosure of which is incorporated herein in its entirety by this reference.

FIELD

One or more examples relate to measurement of analog nodes, and more specifically, on chip measurement of a voltage node.

BACKGROUND

Integrated circuits (chips) are utilized in a variety of operational context, including automotive and industrial contexts.

BRIEF DESCRIPTION OF THE DRAWINGS

To easily identify the discussion of any particular element or act, the most significant digit or digits in a reference number refer to the figure number in which that element is first introduced.

DETAILED DESCRIPTION

Figure 1:
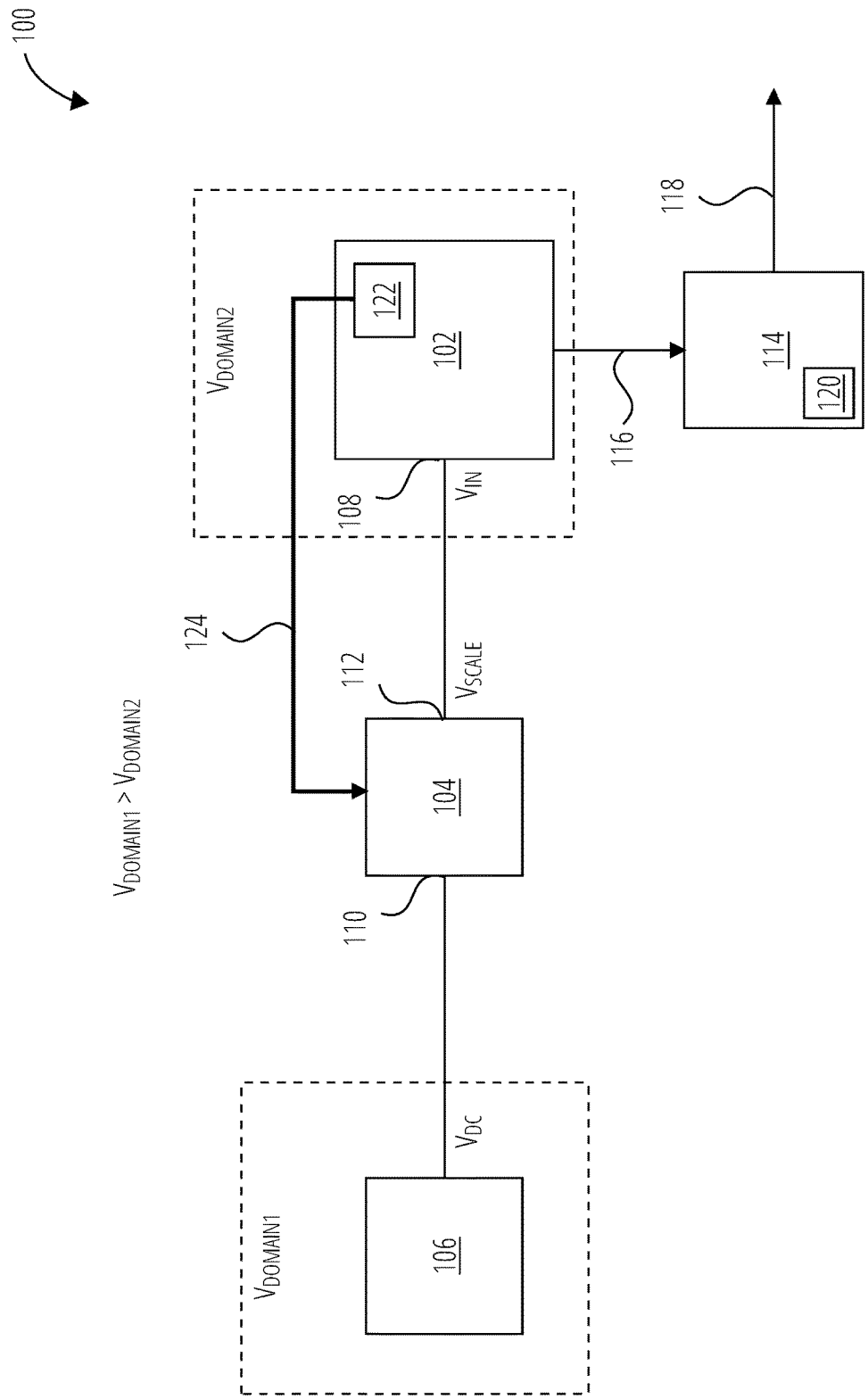
FIG. 1 is a schematic diagram depicting an apparatus, in accordance with one or more examples.

In the following detailed description, reference is made to the accompanying drawings, which form a part hereof, and in which are shown, by way of illustration, specific examples of examples in which the present disclosure may be practiced. These examples are described in sufficient detail to enable a person of ordinary skill in the art to practice the present disclosure. However, other examples enabled herein may be utilized, and structural, material, and process changes may be made without departing from the scope of the disclosure.

The illustrations presented herein are not meant to be actual views of any particular method, system, device, or structure, but are merely idealized representations that are employed to describe the examples of the present disclosure. In some instances, similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed examples. The use of the terms "exemplary," "by example," and "for example," means that the related description is explanatory, and though the scope of the disclosure is intended to encompass the examples and legal equivalents, the use of such terms is not intended to limit the scope of an example or this disclosure to the specified components, steps, features, functions, or the like.

It will be readily understood that the components of the examples as generally described herein and illustrated in the drawings could be arranged and designed in a wide variety of different configurations. Thus, the following description of various examples is not intended to limit the scope of the present disclosure, but is merely representative of various examples. While the various aspects of the examples may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the examples disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein—all of which are encompassed by use of the term "processor." A general-purpose processor may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is to execute computing instructions (e.g., software code, without limitation) related to examples of the present disclosure.

The examples may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least 90% met, at least 95% met, or even at least 99% met.

As used herein, any relational term, such as "over," "under," "on," "underlying," "upper," "lower," etc., is used for clarity and convenience in understanding the disclosure and accompanying drawings and does not connote or depend on any specific preference, orientation, or order, except where the context clearly indicates otherwise.

In this description the term "coupled" and derivatives thereof may be used to indicate that two elements co-operate or interact with each other. When an element is described as being "coupled" to another element, then the elements may be in direct physical or electrical contact or there may be intervening elements or layers present. In contrast, when an element is described as being "directly coupled" to another element, then there are no intervening elements or layers present. The term "connected" may be used in this description interchangeably with the term "coupled," and has the same meaning unless expressly indicated otherwise or the context would indicate otherwise to a person having ordinary skill in the art.

A measurement circuit, such as an analogic-to-digital-converter (ADC), may be used to measure a voltage level at a node and generate a digital value that corresponds to the measured voltage level. An ADC typically has a range of voltage levels for which it may generate a digital value that accurately corresponds to a voltage level present at its input (referred to herein as the "input range"), unless it has the help of other circuitry arranged between a node of interest and an input of the ADC.

In the case of a digital measurement circuit (such as a successive approximation (SAR) ADC, without limitation) implemented in an integrated circuit (IC), the input range is typically constrained by the type of IC technology. As a non-limiting example, a digital ADC implemented in Complementary Metal-Oxide-Semiconductor (CMOS) type integrated circuit, typically has an input range below 3.3V (e.g., 0V to 1.2V, 0V to 1.8V, 0V to 3.3V, without limitation). As used herein, the term "measurement circuit" means a digital measurement circuit implemented in an integrated circuit. In an IC, a measurement circuit in an electronic system with other IC blocks, is referred to herein as "on-chip," i.e., the measurement circuit is on the IC.

Sometimes an IC interfaces with electronic circuits that operate at, or generate voltages at, a higher voltage domain than the chip. As a non-limiting example, voltages levels used to represent signals in voltage domain of a given electronic circuit may be higher than the voltage levels used to represent signals in a voltage domain of an IC (e.g., 5-10V versus 1.2V-3.3V, without limitation) interfacing with the electronic circuit, without limitation.

When a voltage level at a node of interest (a node to be measured) is outside the input range of a measurement circuit, one technique known to the inventors of this disclosure is to measure an input voltage having a voltage level that is some pre-specified ratio of a voltage level at the node of interest. For example, a resistive voltage divider circuit may couple a node of interest to an input of a measurement circuit to provide an input voltage having a voltage level that is a pre-specified ratio of the voltage level at the node of interest. A digital value generated by the measurement circuit corresponds to the voltage level of the input voltage and then is adjusted (e.g., scaled up, without limitation) by a processor that is aware of a relationship (e.g., a transfer function, without limitation) between a voltage at the node of interest and a voltage at an output of the voltage divider circuit.

When a voltage source providing the voltage at the node of interest has a low output impedance, the influence of the low output impedance on the relationship between the node of interest and output of the voltage divider circuit is negligible. So, in the case of a low output impedance voltage source, if a relationship is pre-specified at a processor that receives the digital value generated by the measurement circuit, the processor should, in theory, be able to calculate a digital value representing the voltage level at the node of interest in response to the pre-specified relationship and the digital value representing the voltage level at the input of the measurement circuit.

During operation of a chip, high impedance nodes are often generated for specific applications. In the non-limiting example of automotive chips, high voltage, high impedance (HVHZ) nodes are generated and used intensively. Such HVHZ nodes are monitored, on-chip, including by measurement circuits, to, as non-limiting examples, comply with functional safety requirements. Although various examples are described herein with reference to high voltage, high impedance nodes, the disclosure is not so limited, and various examples may include and/or be related to measuring any voltage node, higher, the same or lower than a measurement circuit, and having high or low impedance. Disclosed examples may be utilized to measure a high impedance, high voltage node, low impedance, high voltage node, high impedance, low voltage node, or a low impedance low voltage node, without limitation.

When a node of interest at a higher voltage domain than a measurement circuit is coupled to the measurement circuit by a high impedance node (i.e., a high impedance output of a voltage source), the inventor of this disclosure appreciates that the influence of the high impedance on the relationship between the node of interest and the output of a voltage divider circuit (or other scaling circuit) is not negligible, and in fact may be significant. So, a pre-specified relationship may not accurately represent a relationship between the output of the voltage divider and the node of interest if it does not account for the influence of such a high impedance.

As a non-limiting example, a HVHZ node may load a resistive voltage divider circuit (since such resistance implemented on-chip is typically much less than impedance of a HVHZ node) causing a voltage drop between the node of interest and the input to the resistive voltage divider circuit.

One technique to address the voltage drop discussed above known to the inventors of this disclosure is to increase the resistance or physical size of resistors in a resistive voltage divider circuit, generally to Mega Ohms (Mohms). However, chip designers may not be able to afford the real-estate requirements for Mohm resistors.

As used herein, the term "high voltage node" means a voltage node having a voltage domain that is higher than a voltage domain of a measurement circuit. The voltage domain may be higher because the voltage levels used to represent signals at the voltage node may be higher than the voltages used to represent signals at the measurement circuit. The voltage domain may be higher because the voltage levels at the voltage node may be higher than an input range at which a measurement circuit can reliability measure a voltage level at the node.

FIG. 1 is a schematic diagram depicting an apparatus 100, in accordance with one or more examples.

Apparatus 100 includes a processor 114, a measurement circuit 102, a voltage scaling circuit 104 and a voltage node 106. Processor 114 is coupled to receive an output of measurement circuit 102. Measurement circuit 102 is coupled to voltage node 106 via voltage scaling circuit 104.

Measurement circuit 102 is, generally, a digital measurement circuit to generate a first digital value 116 that represents a voltage level of input voltage $V_{IN}$ at an input 108 of measurement circuit 102. In one or more examples, input voltage $V_{IN}$ may be for a single ended input, such as a single ended input of a SAR ADC, without limitation.

Voltage scaling circuit 104 couples input 108 of measurement circuit 102 to voltage node 106. Voltage node 106 is associated with voltage domain $V_{Domain1}$, measurement circuit 102 is associated with voltage domain $V_{Domain2}$, and $V_{Domain1}$ is higher than $V_{Domain2}$. Voltage scaling circuit 104 is to generate a scaled voltage $V_{SCALE}$ according to a pre-specified relationship between an input voltage and output voltage of voltage scaling circuit 104, where the input voltage of voltage scaling circuit 104 is voltage $V_{DC}$ appearing at input 110 of voltage scaling circuit 104, and the output voltage of voltage scaling circuit 104 is scaled voltage $V_{SCALE}$ appearing at output 112 of voltage scaling circuit 104. In one or more examples, voltage $V_{SCALE}$ is a scaled-down version of voltage $V_{DC}$, i.e., a voltage level of voltage $V_{SCALE}$ is lower than a voltage level of scaled voltage $V_{DC}$, the relationship between a voltage level of scaled voltage $V_{SCALE}$ and a voltage level of voltage $V_{DC}$, being the pre-specified relationship, which may also be characterized herein as "proportional." In one or more examples, voltage scaling circuit 104 is to generate scaled voltage $V_{SCALE}$ at least partially responsive to control signals 124 for a measurement process generated by logic 122 of measurement circuit 102.

Processor 114 is, generally, to generate second digital value 118 that represents a voltage level of voltage $V_{DC}$ at least partially responsive to first digital value 116 and scaling factor 120. Scaling factor 120 represents the pre-specified relationship between input voltage and output voltage of voltage scaling circuit 104 discussed above. In one or more examples, processor 114 adjusts (e.g., increases, without limitation) first digital value 116 utilizing scaling factor 120 to obtain second digital value 118.

Figure 2:
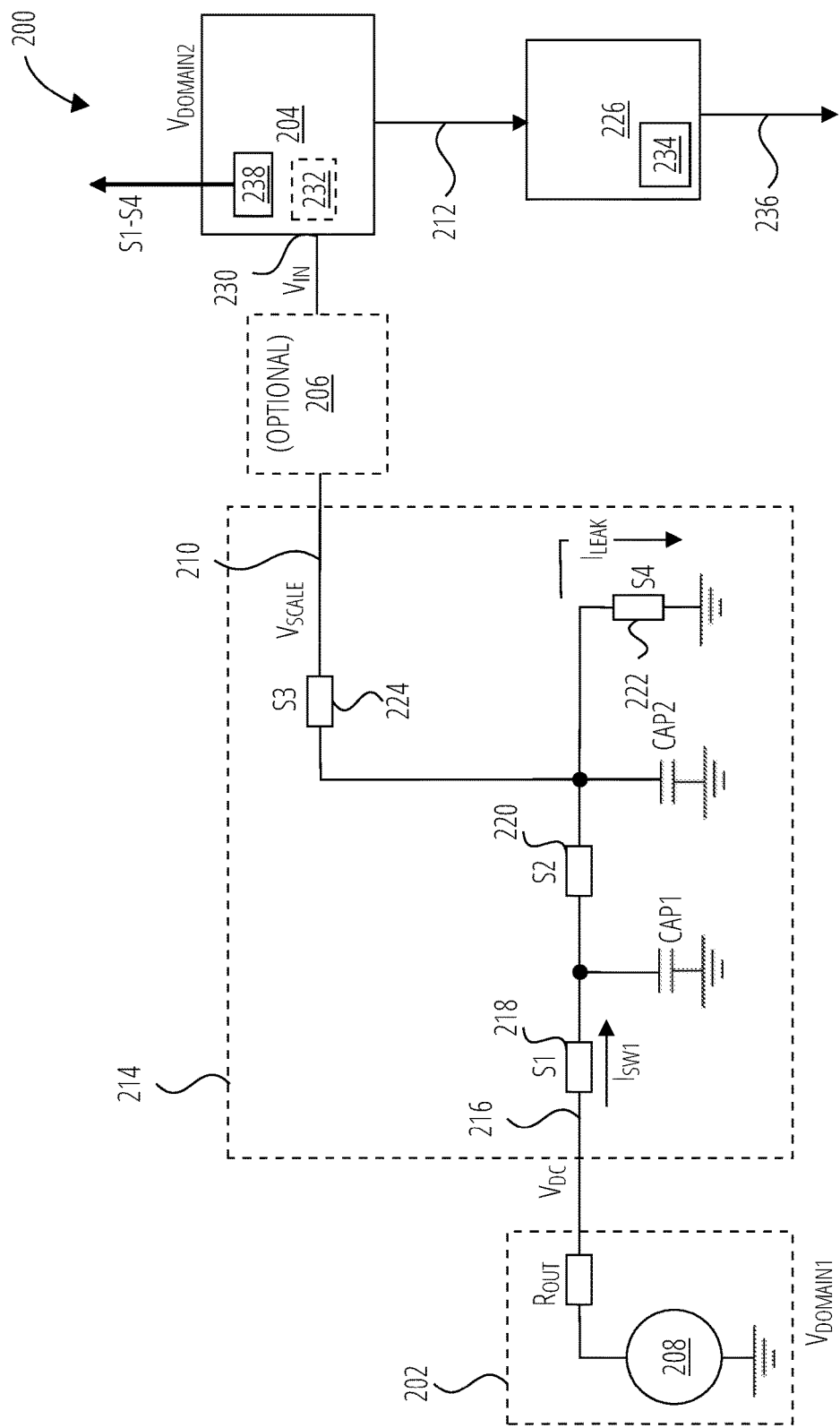
FIG. 2 a schematic diagram depicting a voltage monitoring system, in accordance with one or more examples.

FIG. 2 is a schematic diagram depicting a voltage monitoring system 200 in accordance with one or more examples. Voltage monitoring system 200 is a non-limiting example of apparatus 100.

Voltage monitoring system 200 includes measurement circuit 204 coupled to voltage node 202 via voltage scaling circuit 214 and optional analog connection 206.

Voltage scaling circuit 214 is, generally, to scale-down a voltage from a first voltage level at input 216 to a second, lower, voltage level at output 210. Voltage scaling circuit 214 is coupled at voltage monitoring system 200 to generate a scaled voltage $V_{SCALE}$ (an output voltage of voltage scaling circuit 214) that is a scaled-down version of voltage $V_{DC}$ at voltage node 202 (an input voltage of voltage scaling circuit 214) according to a pre-specified relationship between input voltage and output voltage of voltage scaling circuit 214.

Measurement circuit 204 is, generally, a digital measurement circuit, and optionally includes a successive approximation-register 232 (SAR ADC 232). Measurement circuit 204 is to generate a first digital value 212 that represents a voltage level of an input voltage $V_{IN}$, $V_{IN}$ optionally being for a single ended voltage input of SAR ADC 232.

Processor 226, which is aware of the pre-specified relationship between input voltage and output voltage of voltage scaling circuit 214 via scaling factor 234 (a function or value stored or configured at, or accessible to, processor 226), generates second digital value 236 representing the voltage level of voltage $V_{DC}$ at Voltage node 202 by increasing first digital value 212 utilizing scaling factor 234.

Optional analog connection 206 (optionality indicated by dashed border of block 206) is, generally, to provide an electrical connection between analog nodes of a chip. In FIG. 2, analog connection 206 is an access point to one or more analog nodes for measurement or monitoring of such analog nodes and their analog circuitry, e.g., by measurement circuit 204. Analog connection 206 provides at least a portion of a voltage path between voltage node 202 and measurement circuit 204. In the specific example depicted by FIG. 2, analog connection 206 is to carry scaled voltage $V_{SCALE}$ to input 230 of measurement circuit 204 as $V_{IN}$. In one or more examples, analog connection 206 may couple a voltage scaling circuit 214 physically located at voltage node 202 to a measurement circuit 204 physically located elsewhere on-chip. Analog connection 206 may include, by way of non-limiting example, on-chip metal wires and CMOS switches configured as an analog test bus.

Turning back to voltage scaling circuit 214, voltage scaling circuit 214 includes a number of on-chip capacitors, here two capacitors CAP1 and CAP2, a first end of each of which are respectively coupled to ground, and switches, here switches 218, 220, 222, and 224 controlled to be ON (i.e., turned ON) or OFF (i.e., turned OFF) for switchable coupling and decoupling via respective control signals S1, S2 and S3 as depicted, control signals S1, S2, and S3 generated by logic 238 of measurement circuit 204. In certain CMOS process, on-chip capacitors and transistor switches can be implemented to support high voltage, e.g., a high voltage gate oxide capacitor can support up to 20V, and high voltage NMOS or PMOS transistors building switches can support up to 20V.

Generally speaking, operation of voltage scaling circuit 214 may be controlled at least partially responsive to control signals S1, S2 and S3 generated by logic 238 according to a "charge phase" and a "charge sharing phase." During a charge phase, capacitor CAP1 is coupled (i.e., switchably coupled) to voltage node 202 (via switch 218, which is ON responsive to signal S1) and decoupled (i.e., switchably decoupled) from the remainder of voltage scaling circuit 214 (switch 220 is OFF responsive to signal S2) including capacitor CAP2. Capacitor CAP2 is decoupled (i.e., switchably decoupled) from capacitor CAP1 (switch 220 is OFF responsive to signal S2) and from the output 210 of voltage scaling circuit 214 (switch 224 is OFF responsive to signal S3), and series coupled (i.e., switchably coupled) between ground connections (switch 222 is ON responsive to signal S4), and so reset (charges to) to ground voltage (e.g., 0 volts, without limitation).

During a charge sharing phase, capacitor CAP1 is decoupled (i.e., switchably decoupled) from voltage node 202 (switch 218 is OFF), capacitors CAP1 and CAP2 are coupled (i.e., switchably coupled) to each other (switch 220 is ON responsive to signal S2), and a second end of capacitor CAP2 is decoupled (i.e., switchably decoupled) from ground (switch 222 is OFF responsive to signal S4).

Charge phase and charge sharing phase have the same total charge $Q=V_{DC}*C1$, as expressed by Equation 1: $V_{DC}*C1=V_{SCALE}*(C1+C2)$, where C1 and C2 are the capacitance values for capacitors CAP1 and CAP2, respective, $V_{DC}$ is the voltage provided by DC voltage source 208 through impedance Rout, and $V_{SCALE}$ is the scaled voltage provided by voltage scaling circuit 214. So, by rewriting Equation 1 the relationship between the voltage $V_{DC}$ provided by the voltage source 208 through impedance Rout and scaled voltage $V_{SCALE}$ may be expressed as Equation 2:

$$V_{SCALE} = \frac{C1}{(C1+C2)} * V_{DC}.$$

In one or more examples, capacitance values for capacitors CAP1 and CAP2 may be chosen that are expected to result in a scaled voltage $V_{SCALE}$ within a voltage domain of measurement circuit 204.

Switching current $I_{SW1}$ is the average current between impedance Rout and CAP1 when switch 218 is turned ON, periodically. With an initial charge of 0 Volts across CAP1 at the beginning of each ON cycle of switch 218, the magnitude of current $I_{SW1}$ is expressed by the equation: $I_{SW1}$—$C1*(V_{DC})*f_{S1}$, where $F_{S1}$ is the frequency of the signal S1 used to turn ON and turn OFF switch 218. Switching current $I_{SW1}$ is small (less than 0.1 uA) if there is a slow clock frequency (about 1 KHz to 10 KHz) and small capacitance C1 (about 300 fF). When switching current $I_{SW1}$ is small and the impedance of impedance Rout is up to about 1 Mohm, then the voltage drop across impedance Rout, $I_{SW1}*Rout<0.1V$, which can be ignored. Stated another way, $V_{DC}$ is seen by switch 218 as if there is no voltage drop across impedance Rout and charges CAP1.

When switch 222 and its various CMOS transistors are turned ON it provides a path to ground. When switch 222 and its various CMOS transistors are turned OFF (i.e., transition from ON to OFF), a leakage current $I_{LEAK}$ (more specifically, a mix of reversed biased PN junction leakage current and subthreshold leakage current of high voltage/low voltage transistor switches) flows through the turned OFF CMOS transistors of switch 222 toward ground.

When switch 222 is turned OFF during a charge share phase, some of the charge stored during the charge phase on capacitor CAP1 is drained from capacitors CAP1 and CAP2 via the leakage current $I_{LEAK}$, contributing to the scaling down of $V_{DC}$ to $V_{SCALE}$. Leakage current $I_{LEAK}$ may dramatically increase with temperature, and operation temperature of such a circuit can operate up to, for example, 145° C. in automotive applications.

A low frequency control signal S1 therefore does have at least one drawback, as a slow clock frequency means long clock period, T, and any charge loss due to leakage is a function of the clock OFF period (ON time=OFF time=T/2) for switch 222, i.e., $I_{leak}*T/2$. Therefore, $I_{leak}$, introduces more error with slower clock, which may decrease measurement accuracy.

Figure 3:
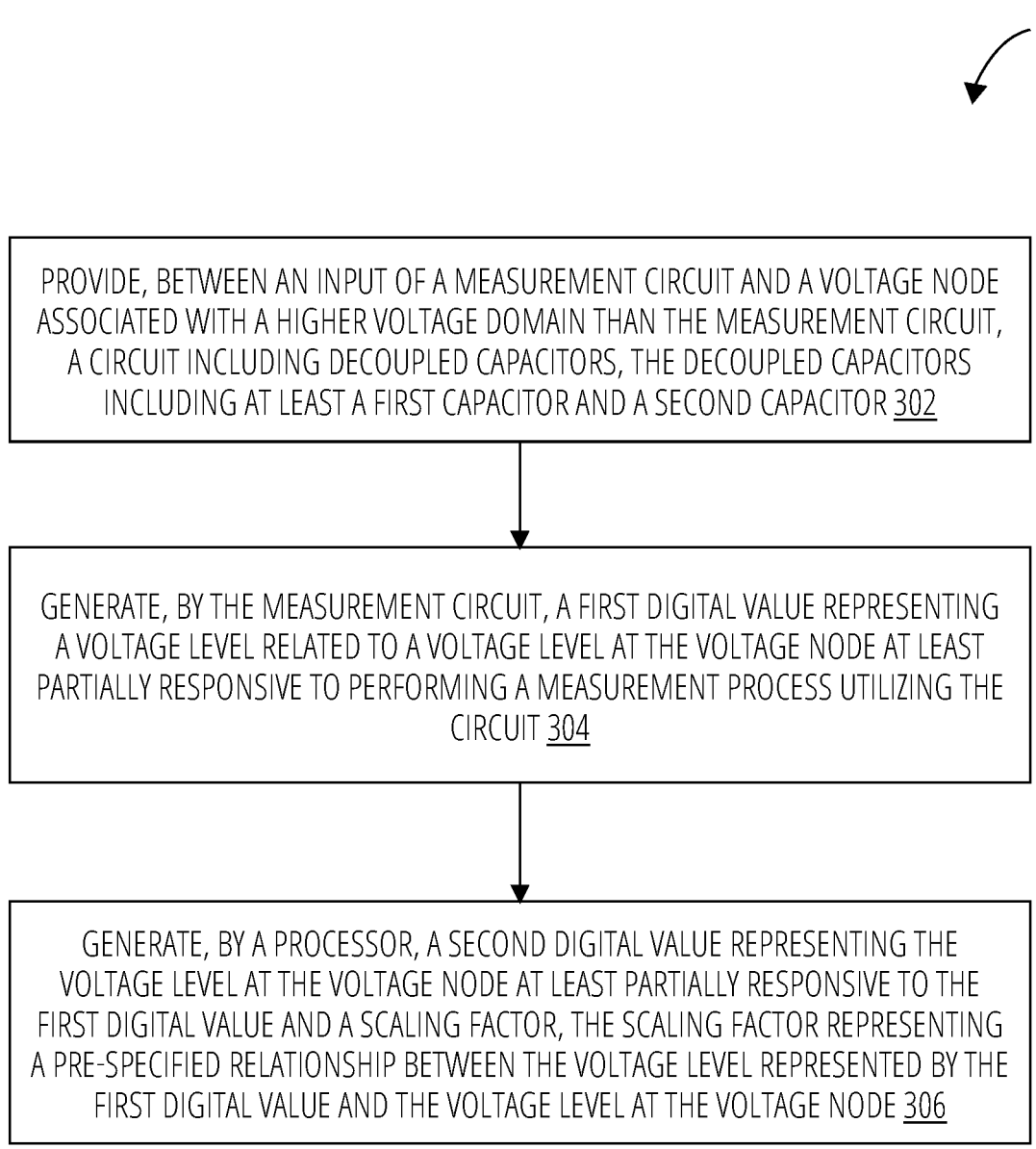
FIG. 3 is a flow diagram depicting a process for measuring a voltage at a high node utilizing a measurement circuit having a lower voltage domain than the voltage domain of the voltage node, in accordance with one or more examples.

FIG. 3 is a flow diagram depicting a process 300 for measuring a voltage at a voltage node utilizing a measurement circuit having a lower voltage domain than the voltage domain of the voltage node, in accordance with one or more examples.

At operation 302, process 300 provides a circuit (e.g., voltage scaling circuit 214, without limitation) including decoupled capacitors (i.e., switchably decoupled capacitors) between an input of a measurement circuit (e.g., measurement input 230 of measurement circuit 204, without limitation) having a second voltage domain (e.g., $V_{DOMAIN2}$ of FIG. 2) and a high voltage node (e.g., Voltage node 202, without limitation) having a first voltage domain (e.g., $V_{DOMAIN1}$ of FIG. 2), the second voltage domain lower than the first voltage domain. The decoupled capacitors include at least a first capacitor (e.g., CAP1 of FIG. 2, without limitation) and a second capacitor (e.g., CAP2 of FIG. 2, without limitation).

As a non-limiting example, voltage node 202 is associated with a higher voltage domain than measurement circuit 204 because voltage domain $V_{DOMAIN1}$ (associated with voltage node 202) uses higher voltage levels to represent signals than voltage domain $V_{DOMAIN2}$ (associated with measurement circuit 204). Alternatively, this may be characterized as domain $V_{DOMAIN2}$ (associated with measurement circuit 204) using lower voltage levels to represent signals than voltage domain $V_{DOMAIN1}$ (associated with voltage node 202).

As a non-limiting example with reference to FIG. 2, capacitors CAP1 and CAP2 are initially decoupled (i.e., are switchably decoupled) from each other (i.e., are "decoupled capacitors") because switch 220, which couples capacitors CAP1 and CAP2, is OFF responsive to signal S2; capacitor CAP1 is initially decoupled (i.e., switchably decoupled) from voltage node 202 because switch 218, which couples capacitor CAP1 with voltage node 202, is OFF responsive to signal S2; a second end of capacitor CAP2 is initially decoupled (i.e., switchably decoupled) from ground because switch 222, which couples the second end of capacitor CAP2 with ground is OFF responsive to signal S4.

At operation 304, process 300 generates, by the measurement circuit (e.g., measurement circuit 204 of FIG. 2, without limitation), a first digital value representing a voltage level (e.g., of an input voltage $V_{IN}$ of the measurement circuit 204, without limitation) that is related to a voltage level of a voltage at the voltage node (e.g., $V_{DC}$ at Voltage node 202, without limitation) at least partially responsive to performing a measurement process that utilizes the circuit including first and second capacitors (e.g., via voltage scaling circuit 214 responsive to signals S1-S4 and timing control by logic 238 at measurement circuit 204 of FIG. 2 for performing the measurement process utilizing voltage scaling circuit 214, without limitation).

At operation 306, process 300 generates, by a processor (e.g., processor 226, without limitation), a second digital value (e.g., second digital value 236, without limitation) representing the voltage level of the voltage at the voltage node (e.g., $V_{DC}$ at voltage node 202, without limitation). Process 300 generates the second digital value at least partially responsive to the first digital value (e.g., first digital value 212, without limitation) and a scaling factor (e.g., scaling factor 234, without limitation). The scaling factor represents a pre-specified relationship between the voltage level represented by the first digital value and a voltage level at the high voltage node (e.g., $V_{DC}$ at voltage node 202, without limitation). In one or more examples, to obtain a digital value that represents the voltage level of the voltage at the high voltage node (e.g., $V_{DC}$ at voltage node 202, without limitation), process 300 adjusts the first digital value at least partially responsive to the relationship represented by the scaling factor to obtain the second digital value.

Figure 4:
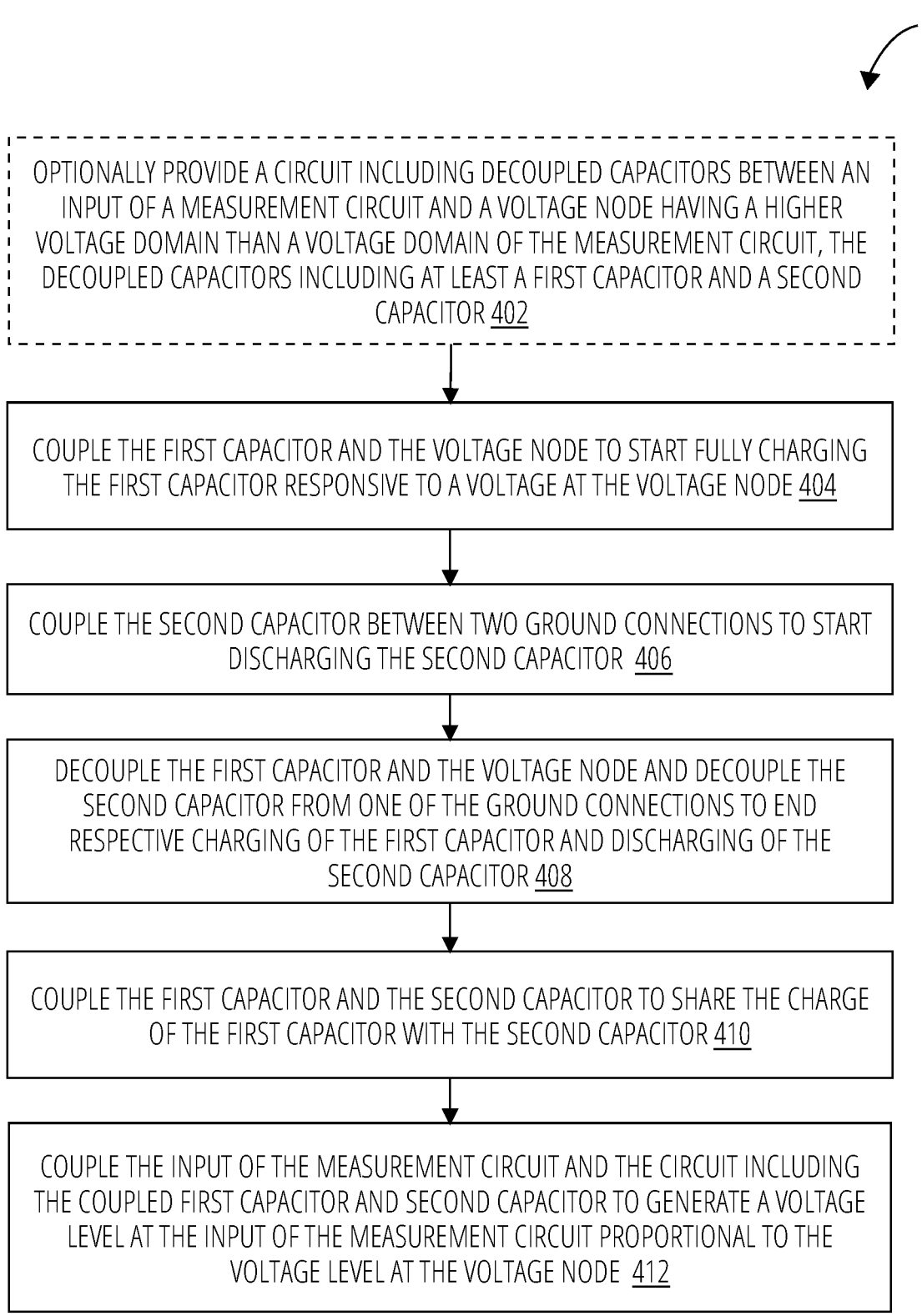
FIG. 4 is a flow diagram depicting a measurement process, in accordance with one or more examples.

FIG. 4 is a flow diagram depicting a measurement process 400, in accordance with one or more examples. Measurement process 400 is a non-limiting example of a measurement process performed at operation 304 of process 300.

At operation 402, measurement process 400 optionally provides a circuit including decoupled capacitors between an input of a measurement circuit and a voltage node, the high voltage node having a higher voltage domain than a voltage domain of the measurement circuit, the decoupled capacitors including at least a first capacitor and a second capacitor, as described with reference to operation 302 of process 300 depicted by FIG. 3.

At operation 404, measurement process 400 couples (e.g., turns ON switch 218 responsive to signal S1, without limitation) the first capacitor and the voltage node to start fully charging the first capacitor at least partially responsive to a voltage at the voltage node. The first capacitor and second capacitor remain decoupled (i.e., switchably decoupled) during operation 404 because switch 220, which couples capacitors CAP1 and CAP2 is OFF responsive to signal S2.

At operation 406, measurement process 400 couples the second capacitor between two ground connections (e.g., turns ON switch 222, responsive to signal S4, without limitation, to couple the second end of capacitor CAP2 to ground such that CAP2 is coupled in series between two ground connections) to start discharging the second capacitor CAP2. Optionally, this may reset the second capacitor CAP2 by draining any charge stored at the second capacitor.

At operation 408, measurement process 400 decouples the first capacitor and the voltage node (e.g., turns OFF switch 218 responsive to signal S1, without limitation), decouples the second end of second capacitor CAP2 and one of the ground connections (e.g., turns OFF switch 222 responsive to signal S4, without limitation), to end respective charging of the first capacitor and discharging of the second capacitor.

At operation 410, measurement process 400 couples (e.g., in parallel, without limitation) the second capacitor and the first capacitor (e.g., turns ON switch 220 responsive to signal S2, without limitation) to share the charge of the first capacitor with the second capacitor. Charge stored at the first capacitor (e.g., during operation 406, without limitation) is shared between the parallel-coupled first and second capacitors during operation 410.

An operation 412, measurement process 400 couples the input of the measurement circuit and a circuit including the coupled (e.g., parallel coupled, without limitation) first capacitor and second capacitor (e.g., turns ON switch 224 responsive to signal S3, without limitation) to generate a voltage level at the input of the measurement circuit proportional to the voltage level at the voltage node.

When measurement process 400 is performed, the voltage generated at the input of the measurement circuit in operation 412 is related (i.e., has a known relationship) to the voltage at the voltage node. Such a relationship may be pre-specified by a scaling factor and utilized to calculate the voltage level of the voltage at the voltage node.

Figure 5:
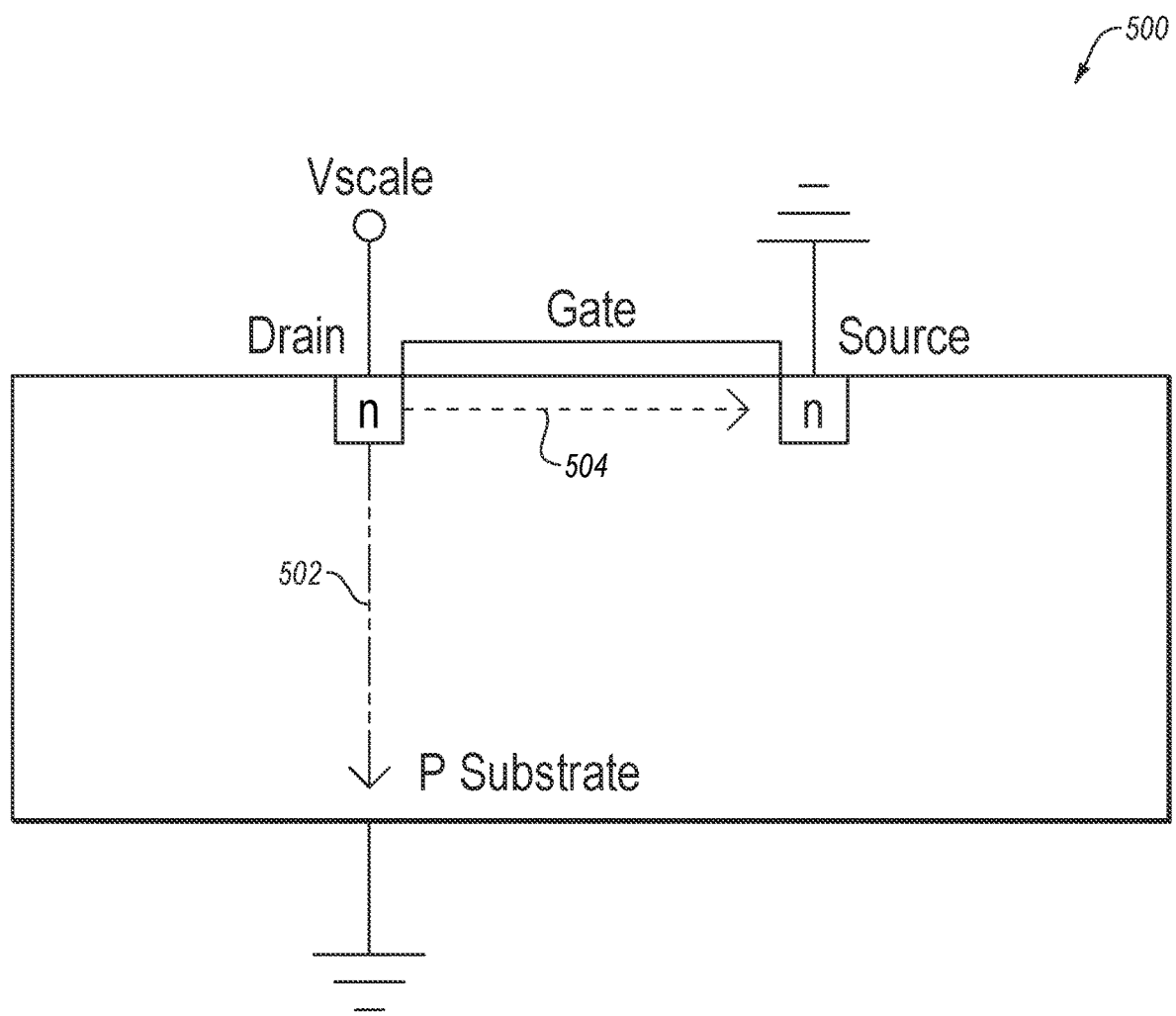
FIG. 5 is a schematic diagram depicting a cross-sectional view of an NMOS switch, in accordance with one or more examples.

FIG. 5 is a schematic diagram depicting a cross-sectional view of an NMOS switch 500. FIG. 5 depicts various leakages including reverse biased PN junction leakage to ground (depicted by reference numeral 502) and subthreshold leakage to ground (depicted by reference numeral 504). For example, one or more of switch 222 of FIG. 2, or switch 622 of FIG. 6 may be implemented by NMOS switch 500. As will be appreciated, NMOS switch 500 has three terminals (i.e., gate, drain, and source). A gate of NMOS switch 500 is coupled to ground to turn the switch OFF, drain may be coupled to scaled voltage $V_{SCALE}$, and a source may be coupled to ground. A P substrate (or P well) is coupled to ground. Notably, some CMOS process use P substrate and some CMOS process use P well, neither exceeds the scope of this disclosure.

As discussed above, when switch 222 is turned OFF during a charge share phase, some of the charge stored during a previous charge phase is drained via a leakage current LEAK, contributing to the scaling down of voltage $V_{DC}$ to scaled voltage $V_{SCALE}$. In one or more examples, a circuitry of an analog connection, such as analog connection 206, may include a number of CMOS transistor type switches coupled to ground. Such switches and their respective CMOS transistors are typically turned OFF when, for example, analog connection 206 provides scaled voltage $V_{SCALE}$ to measurement circuit 204, and so analog connection 206 may exhibit leakage current to ground via the turned OFF switches.

For a voltage monitoring system, such as voltage monitoring system 200, without limitation, to operate in a wide temperature range, the inventor of this disclosure appreciates that it would be desirable to account for leakage current at voltage scaling circuit 214 and analog connection 206 in the measurement process.

Figure 6:
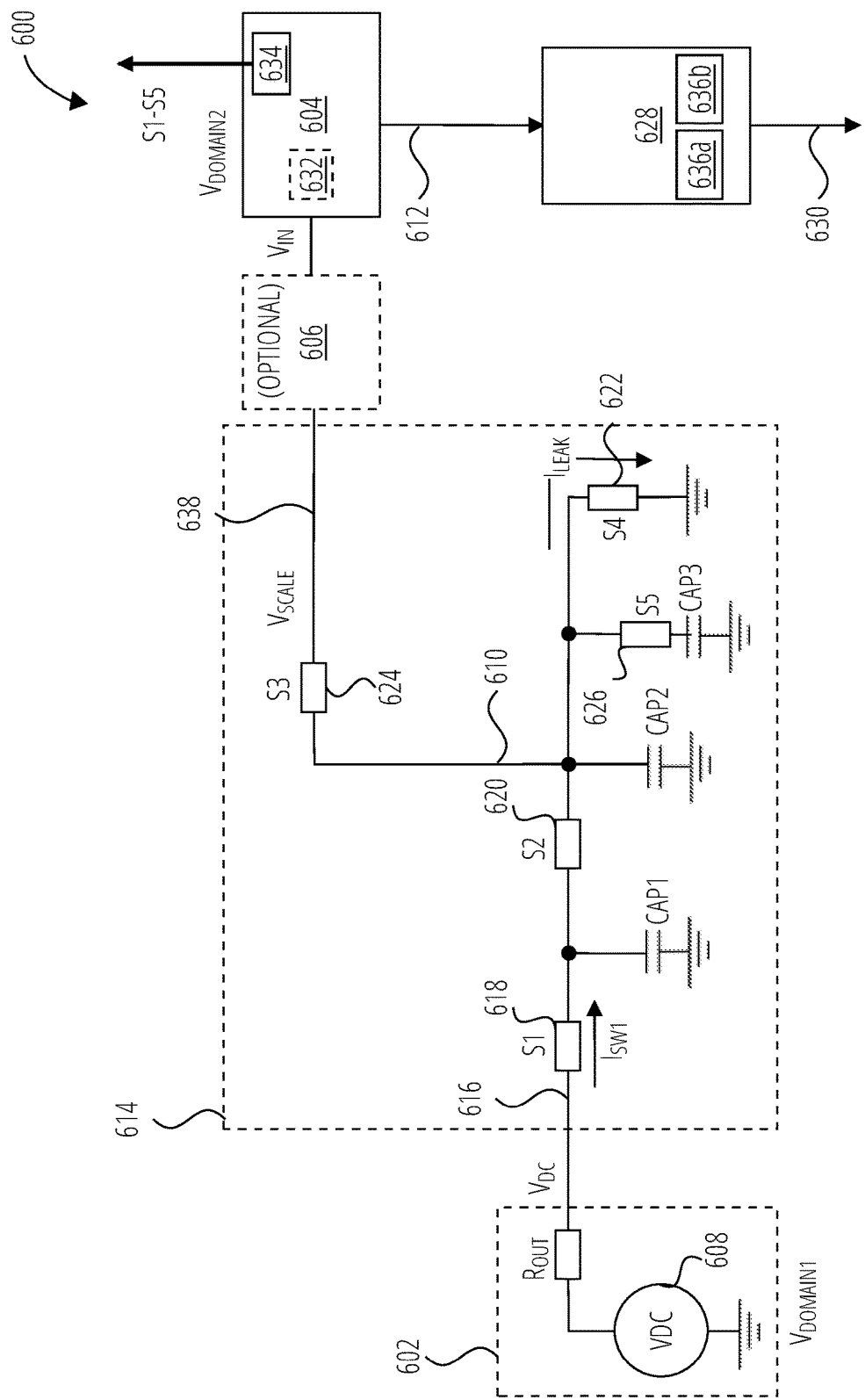
FIG. 6 is a schematic diagram depicting a voltage monitoring system, in accordance with one or more examples.

FIG. 6 is a schematic diagram depicting a voltage monitoring system 600 in accordance with one or more examples. Voltage monitoring system 600 includes measurement circuit 604 coupled to voltage node 602 via voltage scaling circuit 614 and analog connection 606.

Voltage monitoring system 600 includes voltage node 602, voltage scaling circuit 614, optional analog connection 606, measurement circuit 604, and processor 628. Measurement circuit 604 is coupled to voltage node 602 via voltage scaling circuit 614 and optional analog connection 606. Processor 628 receives first digital values 612 generated by measurement circuit 604.

Voltage scaling circuit 614 includes a number of on-chip capacitors, here capacitors CAP1, CAP2, and CAP3, respectively coupled to ground, and switches, here switch 618, 620, 626, and 622, controlled to be ON (or turned ON) or OFF (or turned OFF) via respective control signals S1, S2, S3, S5 and S4 as depicted, control signals S1, S2, S3, S5, and S4 generated by logic 634 of measurement circuit 604. Switch 624 is turned ON or turned OFF by signal S3 generated by logic 634 of measurement circuit 604, to selectively provide a scaled voltage $V_{SCALE}$ toward a measurement input of measurement circuit 604. Voltage scaling circuits 614 includes capacitor CAP3 and switch 626 not included in voltage scaling circuit 214 of FIG. 2.

Voltage monitoring system 600 is similar to voltage monitoring system 200 and so like elements of voltage monitoring system 600 are not re-described here to avoid unnecessary duplication. Voltage monitoring system 600 obtains a measurement result 630 (also referred to herein as a "final digital value 630") where the influence of current leakage LEAK at voltage scaling circuit 614 and optional analog connection 606 may be reduced as compared to voltage monitoring system 200, as discussed below.

In one or more examples, a reduced leakage influenced result (i.e., influence of leakage current on final digital value 630) is obtained by taking two measurements of scaled voltage $V_{DC}$ utilizing voltage scaling circuit 614, optional analog connection 606, and measurement circuit 604 and calculating the difference of the two values obtained from the two measurements. One of the two measurements, i.e., of a first scaled voltage $V_{SCALE1}$, is performed with capacitor CAP3 decoupled (i.e., switchably decoupled) from capacitors CAP1 and CAP2 during the charge share phase (e.g., switch 626 is OFF when switch 620 is turned ON, without limitation), and the other of the two measurements, i.e., of a second scaled voltage $V_{SCALE2}$, is performed with capacitor CAP3 coupled (i.e., switchably coupled) to capacitors CAP1 and CAP3 during the charge share phase (e.g., switch 626 and switch 620 are turned ON, without limitation). A relationship between the difference of the two measurements and $V_{DC}$ is expressed by Equation 3:

$$V_{scale1} - V_{scale2} = V_{DC} * \left( \frac{C1}{C1+C2} - \frac{C1}{C1+C2+C3} \right) + \left( \frac{Ileak*T/2}{C1+C2+C3} - \frac{Ileak*T/2}{C1+C2} \right)$$

Where T/2 is a value representing time duration of charge share phases (assumed to be the same for both measurements), and $I_{LEAK}$ is the leakage current at switch 622 and optionally switches of analog connection 606 during a charge share phase (assumed to be the same for both measurements). In one or more examples, capacitor CAP3 is selected to have a capacitance C3 small such that the difference between capacitance C1+C2 and capacitance C1+C2+C3 is reduced. In one or more examples, a value of capacitance C3 is selected to be equal to, or less than, a value of capacitance C1, and optionally capacitances C1 and C3 are selected to be individually or collectively less than capacitance C2 such that C1+C2>>C3. In one specific example, non-limiting example, C1=150 fF, C2=150 fF*3, C3=150 fF. So, while the voltage measurements (i.e., respective ones of first digital values 612 representing voltage levels of $V_{SCALE1}$ and $V_{SCALE2}$), individually, include error introduced by leakage such that Equation 4:

$$V_{scale1} = \frac{V_{DC}*C1 - Ileak*T/2}{C1+C2}$$

and Equation 5:

$$V_{scale2} = \frac{V_{DC}*C1 - Ileak*T/2}{C1+C2+C3}$$

hold, the difference between $V_{SCALE1}$ and $V_{SCALE2}$ ($V_{SCALE1}$ and $V_{SCALE2}$, respectively, the resultant values from performing the two measurements) substantially reduces influence of leakage current. Processor 628 includes first scaling factor 636a representing a relationship between $V_{SCALE1}/V_{IN}$ and $V_{DC}$ utilizing a first measurement process discussed herein, and second scaling factor 636b representing a relationship between $V_{SCALE2}/V_{IN}$ and $V_{DC}$ utilizing a second measurement process discussed herein.

Notably, voltage monitoring system 600 may measure a voltage in cases where no, or negligible, leakage current is experienced or expected without exceeding the scope of this disclosure. As a non-limiting example, voltage monitoring system 600 may measure a voltage in a temperature range unlikely to cause leakage current, or a temperature range including subranges, some of which may cause leakage current and some of which may not.

Figure 7A:
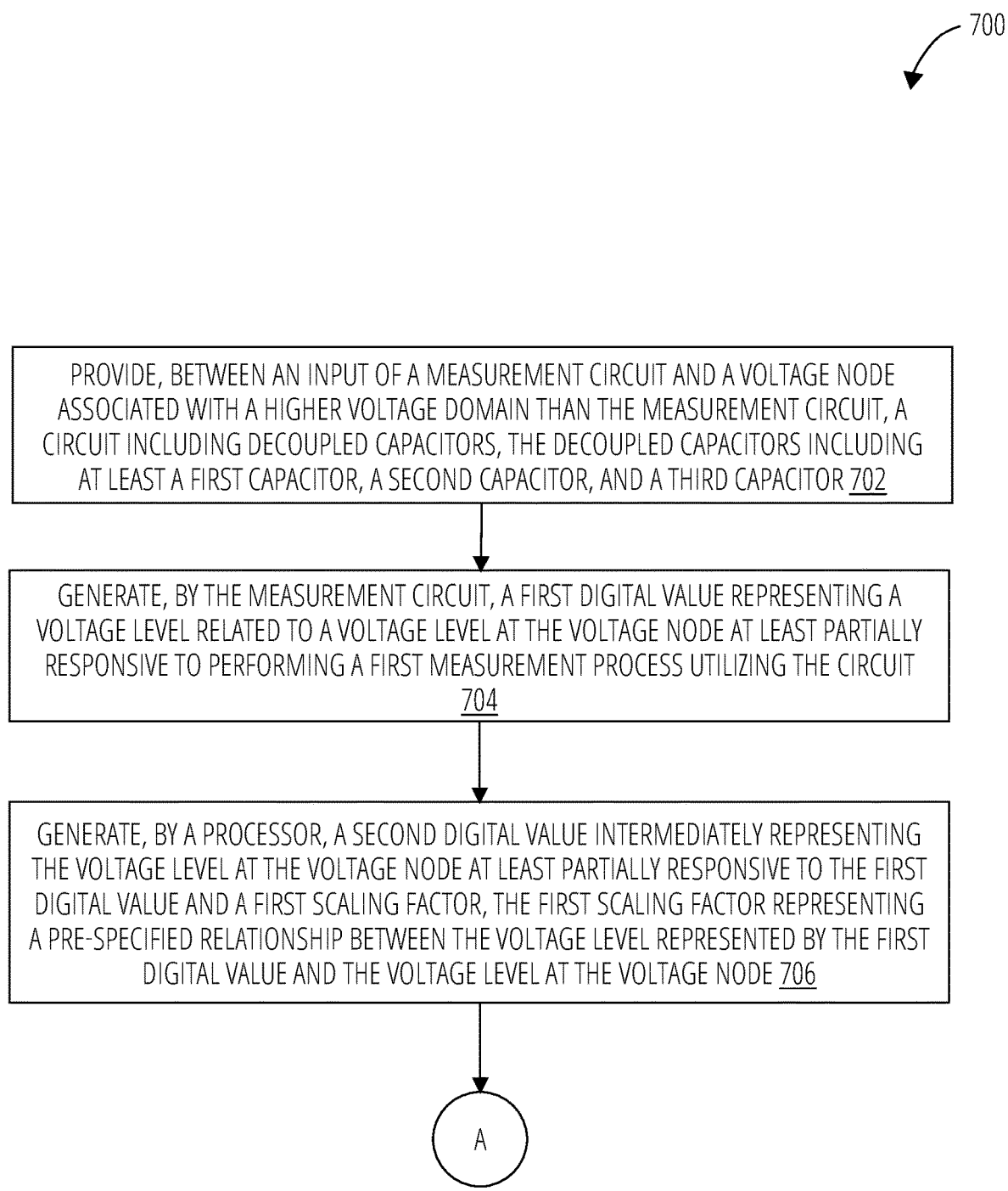
FIGS. 7A and 7B are flow diagrams depicting a process for measuring a voltage at a high node utilizing a measurement circuit having a lower voltage domain than the voltage domain of the voltage node, in accordance with one or more examples.
Figure 7B:
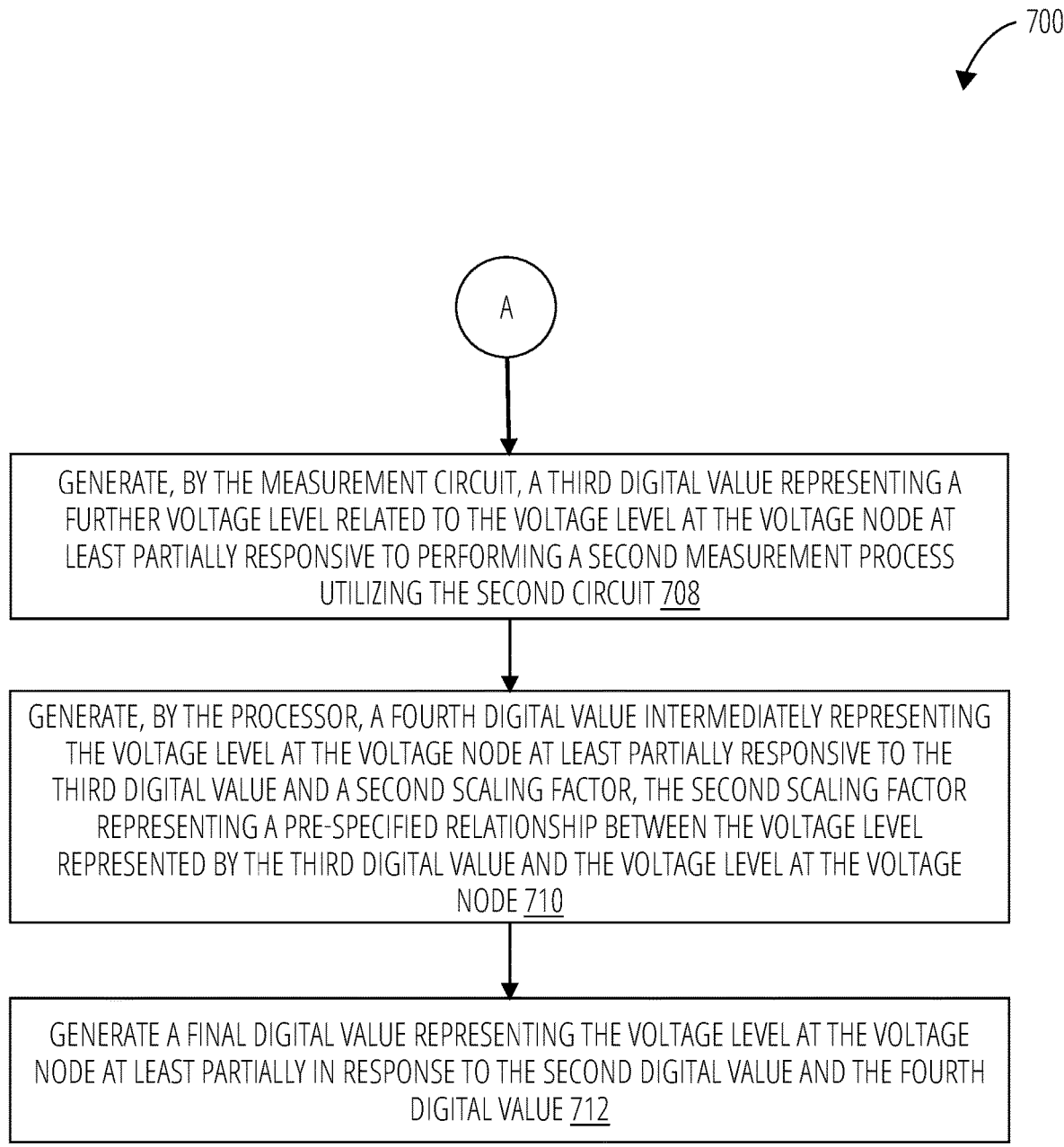

FIG. 7A and FIG. 7B are a flow diagram depicting a process 700 for measuring a voltage at a voltage node utilizing a measurement circuit having a lower voltage domain than the voltage domain of the voltage node, in accordance with one or more examples.

At operation 702, process 700 provides, between an input of a measurement circuit (e.g., voltage input of measurement circuit 604, without limitation) and a voltage node (e.g., voltage node 602, without limitation) associated with a higher voltage domain than the measurement circuit, a circuit including decoupled capacitors (i.e., switchably decoupled). The decoupled capacitors include at least a first capacitor (e.g., CAP1 of FIG. 6, without limitation), a second capacitor (e.g., CAP2 of FIG. 6, without limitation), and a third capacitor (e.g., CAP3 of FIG. 6, without limitation).

As a non-limiting example, voltage node 602 is associated with a higher voltage domain than measurement circuit 604 because voltage domain $V_{DOMAIN1}$ (associated with voltage node 602) uses higher voltage levels to represent signals than voltage domain $V_{DOMAIN2}$ (associated with measurement circuit 604) or uses voltage levels outside an input range of measurement circuit 604. Alternatively, this may be characterized as domain $V_{DOMAIN2}$ (associated with measurement circuit 604) using lower voltage levels to represent signals than voltage domain $V_{DOMAIN1}$ (associated with Voltage node 602).

As a non-limiting example with reference to FIG. 6, a first end of each of capacitors CAP1, CAP2 and CAP3 are coupled (i.e., switchably coupled) to ground, capacitors CAP1 and CAP2 are initially decoupled (i.e., switchably decoupled) from each other because switch 620, which couples CAP1 and CAP2, is OFF responsive to signal S2; capacitor CAP1 is initially decoupled (i.e., switchably decoupled) from voltage node 602 because switch 618, which couples CAP1 with voltage node 602, is OFF responsive to signal S1; a second end of capacitor CAP2 is initially decoupled (i.e., switchably decoupled) from ground because switch 622, which couples the second end of CAP2 with ground, is OFF responsive to signal S4; capacitors CAP2 and CAP3 are initially decoupled (i.e., switchably decoupled) from each other because switch 626, which couples a second end of each of capacitors CAP3 to CAP2 is OFF responsive to signal S5; and a second end of capacitor CAP3 is initially decoupled (i.e., switchably decoupled) from ground because switch 626 and switch 622, which couple the second of capacitor CAP3 to ground, are OFF responsive to signals S5 and S4, respectively.

At operation 704, process 700 generates, by the measurement circuit (e.g., measurement circuit 604, without limitation), a first digital value (e.g., a first one of the digital values 612, without limitation) representing a voltage level (e.g., a voltage level of an input voltage $V_{IN}$ of the measurement circuit 604, without limitation) related to a voltage level at the voltage node (e.g., a voltage level of $V_{DC}$ at voltage node 602, without limitation) at least partially responsive to performing a first measurement process utilizing the circuit including first, second, and third capacitors (e.g., via voltage scaling circuit 614 responsive to control signals S1-S5 and timing control by logic 634 at measurement circuit 604 for performing one or more measurement process utilizing voltage scaling circuit 614, including a first measurement process, without limitation).

At operation 706, process 700 generates, by a processor (e.g., processor 628, without limitation), a second digital value intermediately representing the voltage level at the voltage node. Process 700 generates the second digital value at least partially responsive to the first digital value (e.g., first one of the digital values 612, without limitation) and a first scaling factor (e.g., scaling factor 636*a*, without limitation). The first scaling factor represents a pre-specified relationship between the voltage level represented by the first digital value and the voltage level at the voltage node.

At operation 708, process 700 generates, by the measurement circuit, a third digital value (e.g., a second one of the digital values 612, without limitation) representing a further voltage level related to the voltage level at the voltage node at least partially responsive to performing a second measurement process utilizing the circuit.

At operation 710, process 700 generates, by a processor, a fourth digital value intermediately representing the further voltage level at the voltage node. Process 700 generates the fourth digital value at least partially responsive to the third digital value and a second scaling factor (e.g., scaling factor 636*b*, without limitation). The second scaling factor representing a pre-specified relationship between the voltage level represented by the third digital value and the voltage level at the voltage node.

In one or more examples, to obtain a digital value (e.g., the second digital value in operation 706 or the fourth digital value in operation 710, without limitation) that intermediately represents the voltage level of the voltage at the voltage node, process 700 adjusts the first digital value or third digital value at least partially responsive to the relationship represented by the first scaling factor or second scaling factor, respectively.

At operation 712, process 700 generates a final value representing the voltage level at the voltage node at least partially responsive to the second digital value and the fourth digital value generated by the processor at operation 706 and operation 710, respectively.

Figure 8:
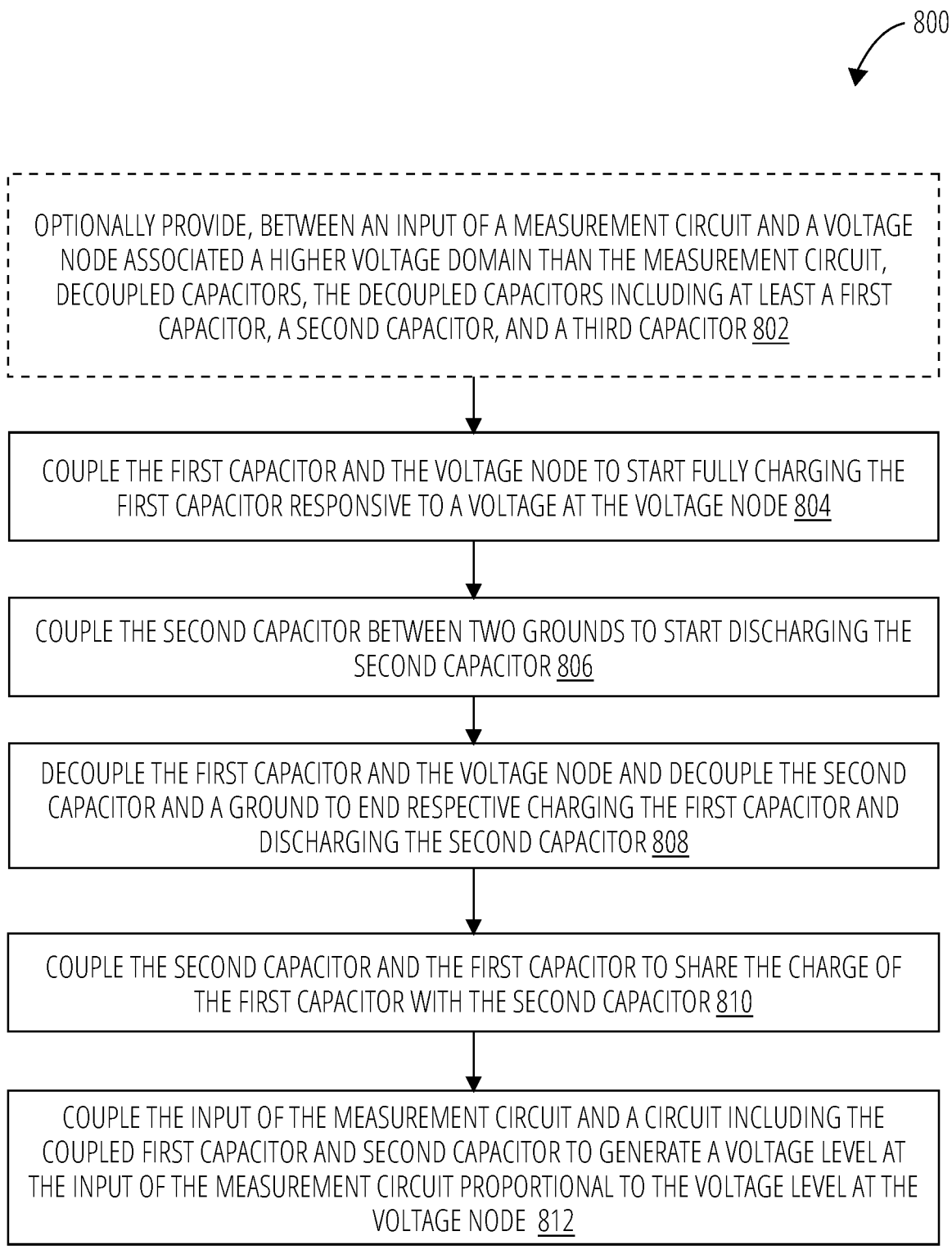
FIG. 8 is a flow diagram depicting a first measurement process of the process depicted by FIG. 7, in accordance with one or more examples.
Figure 9:
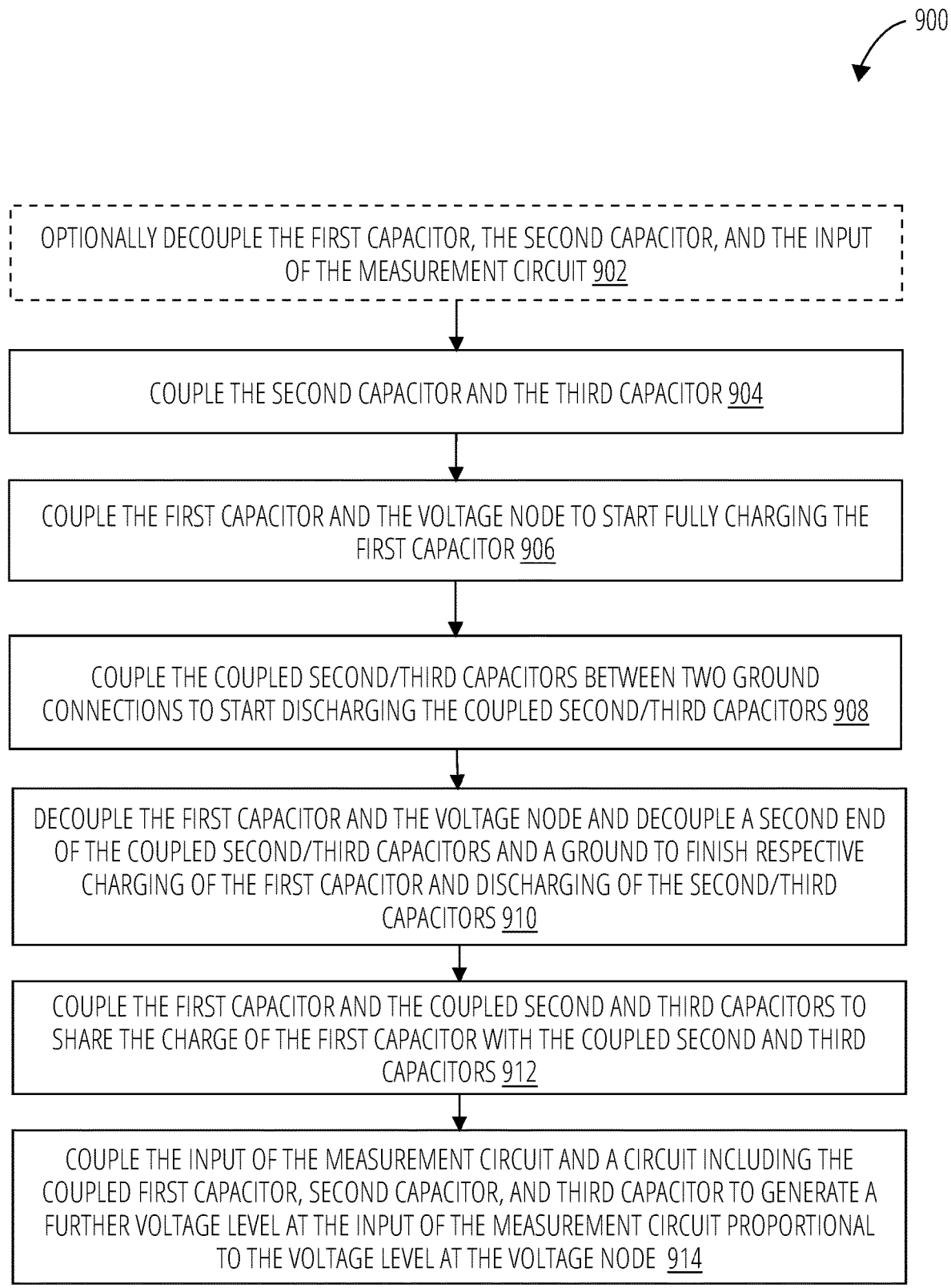
FIG. 9 is a flow diagram depicting a second measurement process of the process depicted by FIG. 7, in accordance with one or more examples.

FIG. 8 and FIG. 9 are flow diagrams depicting first measurement process 800 and a second measurement process 900, respectively, in accordance with one or more examples. First measurement process 800 and second measurement process 900 are non-limiting examples of the first measurement process and second measurement process performed in process 700.

Turning to FIG. 8, in operation 802, first measurement process 800 optionally provides, between an input of a measurement circuit (e.g., voltage input of measurement circuit 604, without limitation) and a voltage node (e.g., voltage node 602, without limitation) associated with a higher voltage domain than the measurement circuit, decoupled capacitors (e.g., switchably decoupled capacitors of voltage scaling circuit 614, without limitation). The decoupled capacitors include at least a first capacitor (e.g., CAP1 of FIG. 6, without limitation), a second capacitor (e.g., CAP2 of FIG. 6, without limitation), and a third capacitor (e.g., CAP3 of FIG. 6, without limitation).

As a non-limiting example with reference to FIG. 6, capacitors CAP1 and CAP2 are initially decoupled (i.e., switchably decoupled) from each other because switch 620, which couples CAP1 and CAP2, is OFF responsive to signal S2; capacitor CAP1 is initially decoupled (i.e., switchably decoupled) from voltage node 602 because switch 618, which couples CAP1 with voltage node 602, is OFF responsive to signal S1; capacitor CAP2 and capacitor CAP3 are initially decoupled (i.e., switchably decoupled) from each other because switch 626, which couples second ends of CAP2 and CAP3 is OFF responsive to signal S5; and the second end of CAP2 is initially decoupled (i.e., switchably decoupled) from ground because switch 622, which couples the second end of CAP2 with ground is OFF responsive to signal S4.

In operation 804, first measurement process 800 couples the first capacitor and the voltage node (e.g., switch 618 is turned ON responsive to signal S1, without limitation) to start fully charging the first capacitor responsive to a voltage at the voltage node.

In operation 806, first measurement process 800 couple the second capacitor between two ground connections (e.g., switch 622 is turned ON responsive to signal S4 coupling the second end of second capacitor CAP2 to ground such that CAP2 is coupled in series between two ground connections, without limitation,) to start discharging the second capacitor.

In operation 808, first measurement process 800 decouples the first capacitor and the voltage node (e.g., switch 618 is turned OFF responsive to signal S1, without limitation) and decouples the second end of the capacitor from ground (e.g., switch 622 is turned OFF responsive to signal S5, without limitation) to end respective charging the first capacitor and discharging the second capacitor.

In operation 810, first measurement process 800 couples the second capacitor and the first capacitor (e.g., switch 620 is turned ON responsive to signal S2 such that CAP1 and CAP2 are coupled in parallel, without limitation) to share the charge of the first capacitor with the second capacitor.

In operation 812, first measurement process 800 couples the input of the measurement circuit and a circuit including the first capacitor and the second capacitor coupled in parallel (e.g., switch 624 is turned ON responsive to signal S4 such that measurement input, CAP1 and CAP2 are coupled in parallel, without limitation) to generate a voltage at the input of the measurement circuit proportional to the voltage at the voltage node (e.g., a first scaled voltage having a voltage level proportional to the voltage level at the voltage node).

Turning to FIG. 9, in optional operation 902, second measurement process 900 decouples (i.e., switchably decouples) the first capacitor, the second capacitor, and the input of the measurement circuit. Second measurement process 900 differs from first measurement process 800, at least in part, by utilizing capacitor CAP3. If second measurement process 900 follows first measurement process 800, the voltage node and first capacitor are already decoupled (i.e., switchably decoupled). So, switch 618 is OFF responsive to signal S1, switch 620 is turned OFF responsive to signal S2, switch 626 is OFF responsive to signal S5, and switch 622 is OFF responsive to signal S4, and switch 624 is OFF responsive to signal S3.

In operation 904, second measurement process 900 couples (i.e., switchably couples) the second capacitor and the third capacitor (e.g., switch 626 is turned ON responsive to signal S5 so that the second capacitor and third capacitor are coupled in parallel, without limitation).

In operation 906, second measurement process 900 couples (i.e., switchably couples) the first capacitor and the voltage node (e.g., switch 618 is turned ON responsive to signal S1, without limitation) to start fully charging the first capacitor responsive to a voltage at the voltage node.

In operation 908, second measurement process 900, couples (i.e., switchably couples) the coupled second/third capacitors in series between two ground connections (e.g., switch 622 is turned ON responsive to signal S4, without limitation, coupling the second end of parallel-coupled second/third capacitors CAP2/CAP3 to ground) to discharge the parallel-coupled second/third capacitors.

In operation 910, second measurement process 900 decouples (i.e., switchably decouples) the first capacitor and the voltage node and decouples (i.e., switchably decouples) a second end of the coupled second/third capacitors from ground (e.g., switches 618 and 622 are turned OFF responsive to signals S1 and S4, respectively, without limitation) to finish respective charging of the first capacitor and discharging of the coupled second/third capacitors.

In operation 912, second measurement process 900 couples the first, second, and third capacitors (e.g., switch 620 is turned ON responsive to signal S2, and switch 626 is already ON responsive to signal S3 such that CAP1, CAP2 and CAP3 are coupled in parallel, and without limitation) to share the charge of the first capacitor with the coupled second/third capacitors.

In operation 914, second measurement process 900 couples the input of the measurement circuit and a circuit including the coupled first, second, and third capacitors (e.g., switch 624 is turned ON responsive to signal S4, without limitation) to generate a further voltage level at the input of the measurement circuit proportional to the voltage level at the voltage node (e.g., a second scaled voltage having a voltage level proportional to the voltage level at the voltage node).

Figure 10:
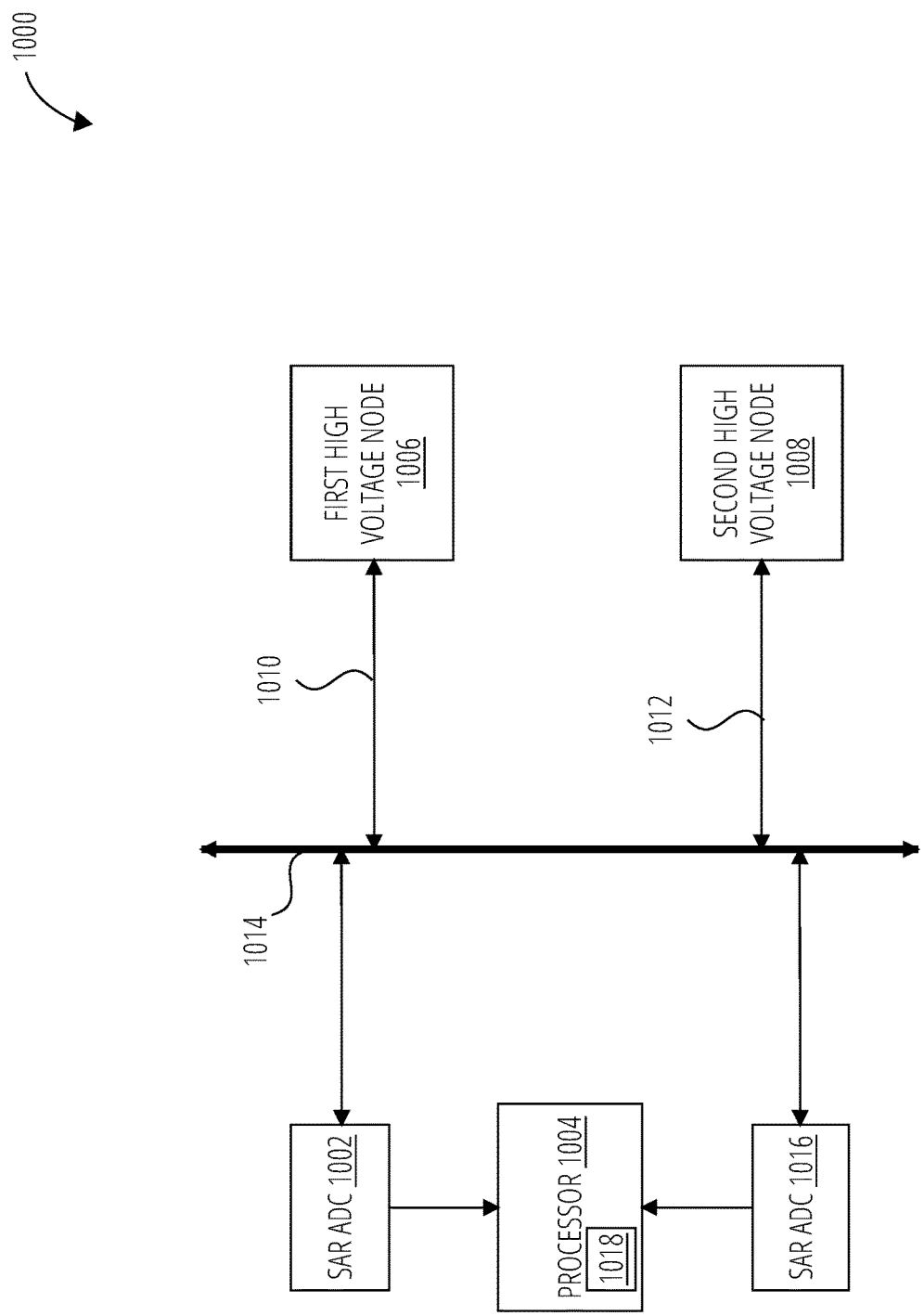
FIG. 10 is a schematic diagram depicting an electronic system, in accordance with one or more examples.

FIG. 10 is a schematic diagram depicting an IC 1000 that includes multiple scaling connections, due to the relatively small layout area cost of each scaling circuit, here first scaling connection 1010 and second scaling connection 1012, for coupling an analog test bus 1014 to high voltage nodes, here, first high voltage node 1006 and second high voltage node 1008. In addition, a first SAR ADC 1002 and a second SAR ADC 1016 are provided, each coupled to analog test bus 1014, and each providing a respective output to a processor 1004. Processor 1004 includes one or more scaling factors 1018.

For a contemplated measurement of first high voltage node 1006 coupled to analog test bus 1014 via first scaling connection 1010, via the analog test bus 1014, a value for scaled voltage $V_{SCALE}$ of first high voltage node 1006 is determined by SAR ADC 1002 and provided to processor 1004. For a contemplated measurement of second high voltage node 1008 coupled to analog test bus 1014 via second scaling connection 1012, via the analog test bus 1014, a value for scaled voltage $V_{SCALE}$ of second high voltage node 1008 is readout by SAR ADC 1016 and provided to processor 1004. Supporting multiple HV nodes at the same time, each with a respective SAR ADC, may allow fast parallel measurement. This may save measurement time and benefit product test.

Figure 11:
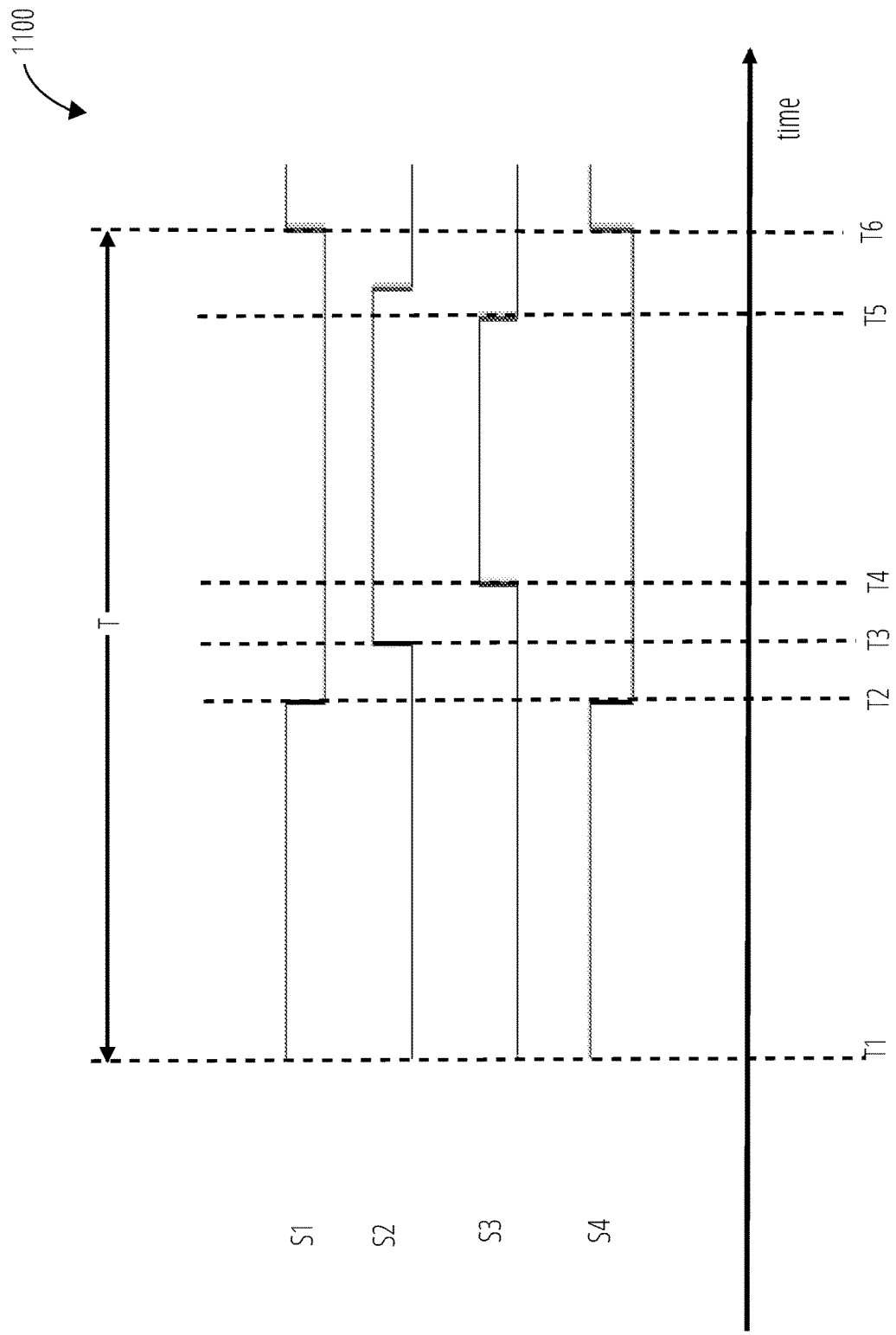
FIG. 11 is a timing diagram depicted signals from a contemplated operation of the voltage monitoring system of FIG. 2, in accordance with one or more examples.

FIG. 11 is a timing diagram 1100 depicting signals S1, S2, S3, and S4 of FIG. 2 during a contemplated operation of voltage monitoring system 200 in accordance with measurement process 400, where a high value indicates that the signal is asserted so that a respective switch turns ON, and a low value indicates that the signal is de-asserted so that a respective switch turns OFF.

At time T1, signals S1 and S4 are asserted to turn ON switches 218 and 222, and thereby couple first capacitor CAP1 with Voltage node 202 and couple a second end of second capacitor CAP2 in series between two ground connections. At time T2, signals S1 and S4 are de-asserted to turn OFF switches 218 and 222, and thereby decouple first capacitor CAP1 and voltage node 202, and decouple the second end of second capacitor CAP2 from the second of the two ground connections. At time T3, signal S2 is asserted to turn ON switch 220 and initiate a charge share between first and second capacitors CAP1 and CAP2. At time T4, signal S3 is asserted to turn ON switch 224 to generate a voltage at the input of the measurement circuit 204 proportional to the voltage at Voltage node 202. At time T5, signal S3 is de-asserted to turn OFF switch 224 and end generation of the voltage at the input of measurement circuit 204. Signal S2 remains asserted, and switch 220 is ON, from time T3 until a time commensurate or after time T5. In a specific non-limiting example, time skew from times T2 to T3 is 100 nanoseconds (ns), from times T3 to T4 is 100 ns, and T period of 100 us.

Figure 12:
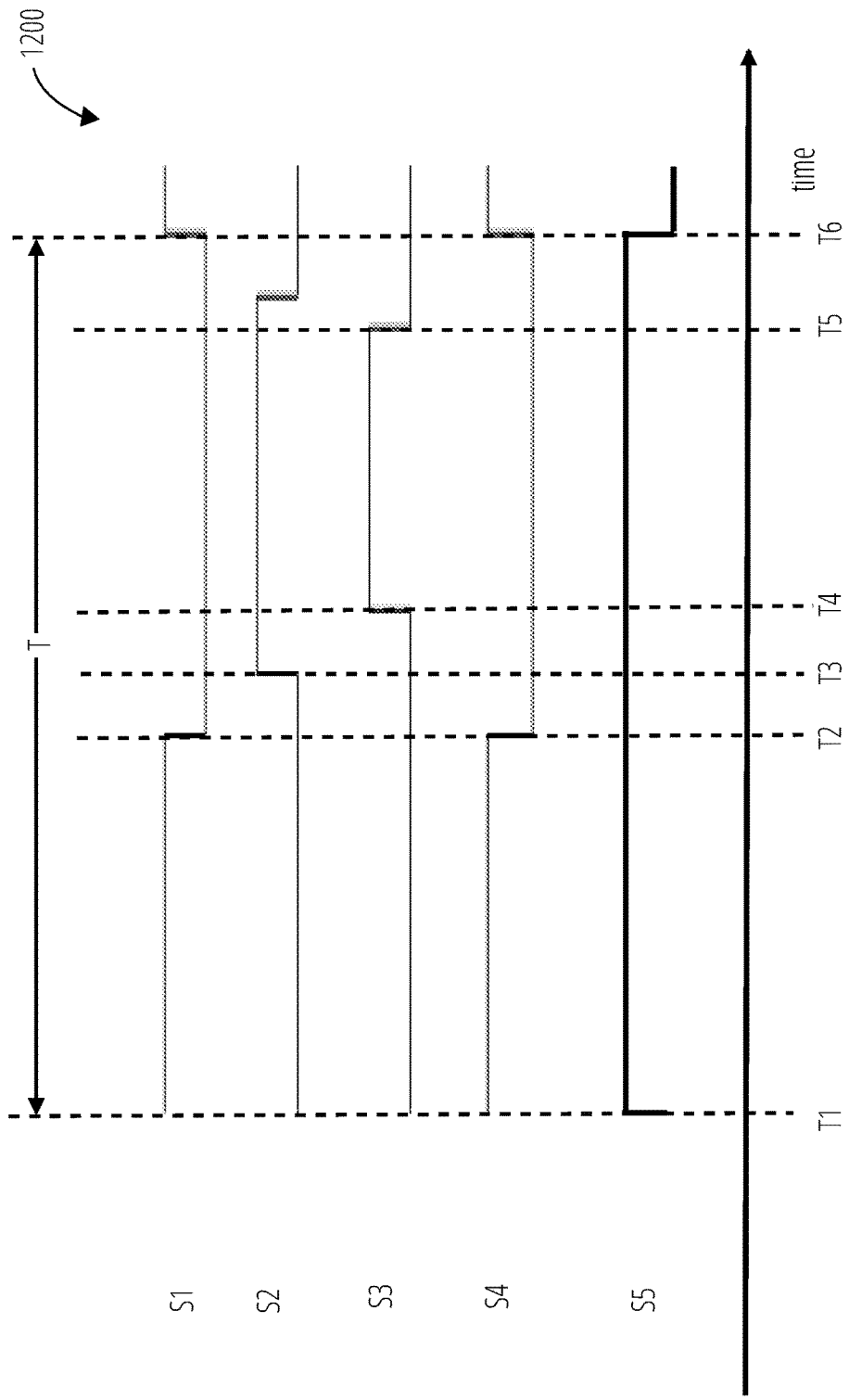
FIG. 12 is a timing diagram depicted signals from a contemplated operation of the voltage monitoring system of FIG. 6, in accordance with one or more examples.

FIG. 12 is a timing diagram 1200 depicting signals S1, S2, S3, S4 and S5 of FIG. 6 during a contemplated operation of voltage monitoring system 600 in accordance with second measurement process 900. Notably, a timing diagram for a contemplated operation of voltage monitoring system 600 in accordance with first measurement process 800 would substantially match timing diagram 1100 with signal S5 being de-asserted for the full period depicted.

Generally the description for times T1, T2, T3, T4 and T5 for timing diagram 1200 are the same as for timing diagram 1100. At time T1, signal S5 is asserted to turn ON switch 626 and couple capacitor CAP3 and capacitor CAP2 in parallel. Signal S5 is asserted for a full period T depicted in FIG. 12—time T1 to time T6.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims, without limitation) are generally intended as "open" terms (e.g., the term "including" should be interpreted as "including, but not limited to," the term "having" should be interpreted as "having at least," the term "includes" should be interpreted as "includes, but is not limited to," without limitation). As used herein, the term "each" means some or a totality. As used herein, the term "each and every" means a totality.

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more," without limitation); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations, without limitation). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additional non-limiting examples include:

Example 1: A method comprising: providing, between an input of a measurement circuit and a voltage node associated with a higher voltage domain than the measurement circuit, a circuit including decoupled capacitors, the decoupled capacitors including at least a first capacitor and a second capacitor; generating, by the measurement circuit, a first digital value representing a voltage level related to a voltage level at the voltage node at least partially responsive to performing a measurement process utilizing the circuit; and generating, by a processor, a second digital value representing the voltage level at the voltage node at least partially responsive to the first digital value and a scaling factor, the scaling factor representing a pre-specified relationship between the voltage level represented by the first digital value and the voltage level at the voltage node.

Example 2: The method according to Example 1, wherein the measurement process comprises: coupling the first capacitor and the voltage node to start fully charging the first capacitor; coupling the second capacitor in series between two ground connections to start fully discharging the second capacitor; decoupling the first capacitor from the voltage node and decoupling the second capacitor from one of the two ground connections to end respective charging and discharging of the first capacitor and the second capacitor; coupling, in parallel, the first capacitor and the second capacitor to share the charge of the first capacitor with the second capacitor; and coupling the input of the measurement circuit and a circuit including the parallel-coupled first capacitor and second capacitor to generate a voltage level at the input of the measurement circuit proportional to the voltage level at the voltage node.

Example 3: An apparatus, comprising: a measurement circuit to generate a first digital value representing a voltage level at an input of the measurement circuit, the measurement circuit comprising logic to generate control signals for a measurement process; a voltage scaling circuit to couple the input of the measurement circuit to a voltage node associated with a higher voltage domain higher than the measurement circuit, the voltage scaling circuit, responsive to control signals generated by the logic of the measurement circuit, to generate a scaled voltage according to a pre-specified relationship between input voltage and output voltage of the voltage scaling circuit; and a processor to generate a second digital value representing the voltage level at the voltage node at least partially responsive to: the first digital value and a scaling factor, the scaling factor representing the pre-specified relationship between input voltage and output voltage of the voltage scaling circuit.

Example 4: The apparatus according to Example 3, wherein the voltage scaling circuit comprises: a first capacitor; a second capacitor; and switches to alternately couple or decouple the first capacitor and second capacitor at least partially responsive to the control signals for the measurement process.

Example 5: The apparatus according to any of Examples 3 and 4, wherein the control signals for the measurement process to control the voltage scaling circuit to: couple the first capacitor and the voltage node to start fully charging the first capacitor; couple the second capacitor in series between ground connections to start discharging the second capacitor; decouple the first capacitor and the voltage node and decouple the second capacitor and ground connections to end charging of the first capacitor and discharging of the second capacitor; couple the second capacitor and the first capacitor to share the charge of the first capacitor with the second capacitor; and couple the input of the measurement circuit and the coupled first and second capacitors to generate a voltage level at the input of the measurement circuit proportional to the voltage level at the voltage node.

Example 6: The apparatus according to any of Examples 3 through 5, wherein the voltage scaling circuit comprises:

an input for switchable coupling to the first capacitor; and an output for switchable coupling to the first capacitor and the second capacitor.

Example 7: The apparatus according to any of Examples 3 through 6, wherein the measurement circuit comprises a successive-approximation-register (SAR) analog-to-digital-converter (ADC).

Example 8: The apparatus according to any of Examples 3 through 7, comprising an analog connection to couple the measurement circuit with the voltage scaling circuit.

Example 9: A method, comprising: providing, between an input of a measurement circuit and a voltage node associated with a higher voltage domain than the measurement circuit, a circuit including decoupled capacitors, the decoupled capacitors including at least a first capacitor, a second capacitor, and a third capacitor; generating, by the measurement circuit, a first digital value representing a voltage level related to a voltage level at the voltage node at least partially responsive to performing a first measurement process utilizing the circuit; generating, by a processor, a second digital value intermediately representing the voltage level at the voltage node at least partially responsive to the first digital value and a first scaling factor, the first scaling factor representing a pre-specified relationship between the voltage level represented by the first digital value and the voltage level at the voltage node; generating, by the measurement circuit, a third digital value representing a further voltage level related to the voltage level at the voltage node at least partially responsive to performing a second measurement process utilizing the circuit; generating, by a processor, a fourth digital value intermediately representing the voltage level at the voltage node at least partially responsive to the third digital value and a second scaling factor; and generating a final digital value representing the voltage level at the voltage node at least partially in response to the second digital value and the fourth digital value.

Example 10: The method according to Example 9, wherein the first measurement process comprises: coupling the first capacitor and the voltage node to start fully charging the first capacitor; coupling the second capacitor in series between two ground connections to start discharging the second capacitor; decoupling the first capacitor and the voltage node and decouple the second capacitor and a ground connection to end respective charging the first capacitor and discharging the second capacitor; coupling the first capacitor and the second capacitor to share the charge of the first capacitor with the second capacitor; and coupling the input of the measurement circuit and the circuit including the coupled first capacitor and the second capacitor to generate a voltage level at the input of the measurement circuit proportional to the voltage level at the voltage node.

Example 11: The method according to any of Examples 9 and 10, wherein the second measurement process comprises: coupling the second capacitor and third capacitor; coupling the first capacitor and the voltage node to start fully charging the first capacitor; coupling the coupled second and third capacitors between two ground connections to start discharging the coupled second and third capacitors; decoupling the first capacitor from the voltage node and decoupling an end of the coupled first and second capacitors from one of the two ground connections to finish respective charging the first capacitor and discharging the coupled second and third capacitors; coupling the first capacitor and the coupled second and third capacitors to share the charge of the first capacitor with the coupled second and third capacitor; and coupling the input of the measurement circuit and the circuit including the coupled first, second, and third capacitors to generate a further voltage level at the input of the measurement circuit proportional to the voltage level at the voltage node.

Example 12: An apparatus, comprising: a measurement circuit to generate digital values representing voltage levels at an input of the measurement circuit, the measurement circuit comprising logic to generate control signals, including control signals for a first measurement process and control signals for a second measurement process; a voltage scaling circuit to couple the input of the measurement circuit with a voltage node associated with a higher voltage domain than the measurement circuit, the voltage scaling circuit: responsive to control signals for the first measurement process generated by the logic of the measurement circuit, to generate a first scaled voltage at the input of the measurement circuit according to a first pre-specified relationship between input voltage and output voltage of the voltage scaling circuit; and responsive to control signals for the second measurement process generated by the logic of the measurement circuit, to generate a second scaled voltage at the input of the measurement circuit according to a second pre-specified relationship between input voltage and output voltage of the voltage scaling circuit, a processor to generate digital values intermediately representing a voltage level at the voltage node at least partially responsive to a first scaling factor representing the first pre-specified relationship between input voltage and output voltage of the voltage scaling circuit, a second scaling factor representing the second pre-specified relationship between input and output voltage of the voltage scaling circuit, and digital values generated by the measurement circuit.

Example 13: The apparatus according to Example 12, wherein the digital values generated by the measurement circuit including: a first digital value representing the first scaled voltage generated by the voltage scaling circuit responsive to control signals for the first measurement process; and a second digital value representing the second scaled voltage generated by the voltage scaling circuit responsive to control signals for the second measurement process.

Example 14: The apparatus according to any of Examples 12 and 13, wherein the voltage scaling circuit comprises: a first capacitor; a second capacitor; a third capacitor; and switches to alternately couple or decouple the first capacitor, second capacitor, and third capacitor at least partially responsive to the control signals for each of the first measurement process and the second measurement process.

Example 15: The apparatus according to any of Examples 12 through 14, wherein the control signals for the first measurement process to control the voltage scaling circuit to: couple the first capacitor and the voltage node to start charge of the first capacitor; couple the second capacitor between two ground connections to start discharge of the second capacitor; decouple the first capacitor from the voltage node and decouple an end of the second capacitor and one of the two ground connections to finish charge of the first capacitor and discharge of the second capacitor; couple the first capacitor and the second capacitor to share the charge of the first capacitor with the second capacitor; and couple the input of the measurement circuit and an output of the voltage scaling circuit to generate a voltage level at the input of the measurement circuit proportional to the voltage level at the voltage node.

Example 16: The apparatus according to any of Examples 12 through 15, wherein the control signals for the second measurement process to control the voltage scaling circuit to: couple the second capacitor and the third capacitor;

couple the first capacitor and the voltage node to start charge of the first capacitor; couple the coupled second and third capacitors between two ground connections to start discharge of the coupled second and third capacitors; decouple the first capacitor from the voltage node and decouple an end of the coupled second and third capacitors from one of the two ground connections to finish charge of the first capacitor and discharge of the coupled second and third capacitors; couple the first capacitor and the coupled second and third capacitors to share the charge of the first capacitor with the coupled second and third capacitors; and couple the input of the measurement circuit and an output of the voltage scaling circuit to generate a further voltage level at the input of the measurement circuit proportional to the voltage level at the voltage node.

Example 17: The apparatus according to any of Examples 12 through 16, wherein the measurement circuit comprises a successive-approximation-register (SAR) analog-to-digital-converter (ADC).

Example 18: The apparatus according to any of Examples 12 through 17, comprising an analog connection to couple the measurement circuit with the voltage scaling circuit.

Example 19: An electronic system, comprising: at least two successive-approximation-register (SAR) analog-to-digital-converters (ADCs); a first scaling connection; a second scaling connection; a bus to route a voltage signal provided by the first and second scaling connection to either one of the at least two SAR ADCs; and a processor with a scaling factor that represents a relationship between a level of the voltage signal routed by the bus and a level of a voltage signal generated by a respective device coupled to a respective input of each of the first and second scaling connections, wherein respective devices coupled to the respective input of each of the first and second scaling connections each have a voltage domain that is higher than a voltage domain of the SAR ADCs.

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. A method comprising:
    providing, between an input of a measurement circuit and a voltage node associated with a higher voltage domain than the measurement circuit, a circuit including decoupled capacitors, the decoupled capacitors including at least a first capacitor and a second capacitor;
    generating, by the measurement circuit, a first digital value representing a voltage level related to a voltage level at the voltage node at least partially responsive to performing a measurement process utilizing the circuit; and
    generating, by a processor, a second digital value representing the voltage level at the voltage node at least partially responsive to the first digital value and a scaling factor, the scaling factor representing a pre-specified relationship between the voltage level represented by the first digital value and the voltage level at the voltage node.

2. The method of claim 1, wherein the measurement process comprises:
    coupling the first capacitor and the voltage node to start fully charging the first capacitor;
    coupling the second capacitor in series between two ground connections to start fully discharging the second capacitor;
    decoupling the first capacitor from the voltage node and decoupling the second capacitor from one of the two ground connections to end respective charging and discharging of the first capacitor and the second capacitor;
    coupling, in parallel, the first capacitor and the second capacitor to share the charge of the first capacitor with the second capacitor; and
    coupling the input of the measurement circuit and a circuit including the parallel-coupled first capacitor and second capacitor to generate a voltage level at the input of the measurement circuit proportional to the voltage level at the voltage node.

3. An apparatus, comprising:
    a measurement circuit to generate a first digital value representing a voltage level at an input of the measurement circuit, the measurement circuit comprising logic to generate control signals for a measurement process;
    a voltage scaling circuit to couple the input of the measurement circuit to a voltage node associated with a higher voltage domain higher than the measurement circuit,
    the voltage scaling circuit, responsive to control signals generated by the logic of the measurement circuit, to generate a scaled voltage according to a pre-specified relationship between input voltage and output voltage of the voltage scaling circuit; and
    a processor to generate a second digital value representing the voltage level at the voltage node at least partially responsive to: the first digital value and a scaling factor, the scaling factor representing the pre-specified relationship between input voltage and output voltage of the voltage scaling circuit.

4. The apparatus of claim 3, wherein the voltage scaling circuit comprises:
    a first capacitor;
    a second capacitor; and
    switches to alternately couple or decouple the first capacitor and second capacitor at least partially responsive to the control signals for the measurement process.

5. The apparatus of claim 4, wherein the control signals for the measurement process to control the voltage scaling circuit to:
    couple the first capacitor and the voltage node to start fully charging the first capacitor;
    couple the second capacitor in series between ground connections to start discharging the second capacitor;
    decouple the first capacitor and the voltage node and decouple the second capacitor and ground connections to end charging of the first capacitor and discharging of the second capacitor;
    couple the second capacitor and the first capacitor to share the charge of the first capacitor with the second capacitor; and
    couple the input of the measurement circuit and the coupled first and second capacitors to generate a voltage level at the input of the measurement circuit proportional to the voltage level at the voltage node.

6. The apparatus of claim 4, wherein the voltage scaling circuit comprises:

an input for switchable coupling to the first capacitor; and
an output for switchable coupling to the first capacitor and the second capacitor.

7. The apparatus of claim 3, wherein the measurement circuit comprises a successive-approximation-register (SAR) analog-to-digital-converter (ADC).

8. The apparatus of claim 3, comprising an analog connection to couple the measurement circuit with the voltage scaling circuit.

9. A method, comprising:
providing, between an input of a measurement circuit and a voltage node associated with a higher voltage domain than the measurement circuit, a circuit including decoupled capacitors, the decoupled capacitors including at least a first capacitor, a second capacitor, and a third capacitor;
generating, by the measurement circuit, a first digital value representing a voltage level related to a voltage level at the voltage node at least partially responsive to performing a first measurement process utilizing the circuit;
generating, by a processor, a second digital value intermediately representing the voltage level at the voltage node at least partially responsive to the first digital value and a first scaling factor, the first scaling factor representing a pre-specified relationship between the voltage level represented by the first digital value and the voltage level at the voltage node;
generating, by the measurement circuit, a third digital value representing a further voltage level related to the voltage level at the voltage node at least partially responsive to performing a second measurement process utilizing the circuit;
generating, by a processor, a fourth digital value intermediately representing the voltage level at the voltage node at least partially responsive to the third digital value and a second scaling factor; and
generating a final digital value representing the voltage level at the voltage node at least partially in response to the second digital value and the fourth digital value.

10. The method of claim 9, wherein the first measurement process comprises:
coupling the first capacitor and the voltage node to start fully charging the first capacitor;
coupling the second capacitor in series between two ground connections to start discharging the second capacitor;
decoupling the first capacitor and the voltage node and decouple the second capacitor and a ground connection to end respective charging the first capacitor and discharging the second capacitor;
coupling the first capacitor and the second capacitor to share the charge of the first capacitor with the second capacitor; and
coupling the input of the measurement circuit and the circuit including the coupled first capacitor and the second capacitor to generate a voltage level at the input of the measurement circuit proportional to the voltage level at the voltage node.

11. The method of claim 9, wherein the second measurement process comprises:
coupling the second capacitor and third capacitor;
coupling the first capacitor and the voltage node to start fully charging the first capacitor;
coupling the coupled second and third capacitors between two ground connections to start discharging the coupled second and third capacitors;
decoupling the first capacitor from the voltage node and decoupling an end of the coupled first and second capacitors from one of the two ground connections to finish respective charging the first capacitor and discharging the coupled second and third capacitors;
coupling the first capacitor and the coupled second and third capacitors to share the charge of the first capacitor with the coupled second and third capacitor; and
coupling the input of the measurement circuit and the circuit including the coupled first, second, and third capacitors to generate a further voltage level at the input of the measurement circuit proportional to the voltage level at the voltage node.

12. An apparatus, comprising:
a measurement circuit to generate digital values representing voltage levels at an input of the measurement circuit, the measurement circuit comprising logic to generate control signals, including control signals for a first measurement process and control signals for a second measurement process;
a voltage scaling circuit to couple the input of the measurement circuit with a voltage node associated with a higher voltage domain than the measurement circuit, the voltage scaling circuit:
responsive to control signals for the first measurement process generated by the logic of the measurement circuit, to generate a first scaled voltage at the input of the measurement circuit according to a first pre-specified relationship between input voltage and output voltage of the voltage scaling circuit; and
responsive to control signals for the second measurement process generated by the logic of the measurement circuit, to generate a second scaled voltage at the input of the measurement circuit according to a second pre-specified relationship between input voltage and output voltage of the voltage scaling circuit,
a processor to generate digital values intermediately representing a voltage level at the voltage node at least partially responsive to a first scaling factor representing the first pre-specified relationship between input voltage and output voltage of the voltage scaling circuit, a second scaling factor representing the second pre-specified relationship between input and output voltage of the voltage scaling circuit, and digital values generated by the measurement circuit.

13. The apparatus of claim 12, wherein the digital values generated by the measurement circuit including:
a first digital value representing the first scaled voltage generated by the voltage scaling circuit responsive to control signals for the first measurement process; and
a second digital value representing the second scaled voltage generated by the voltage scaling circuit responsive to control signals for the second measurement process.

14. The apparatus of claim 13, wherein the voltage scaling circuit comprises:
a first capacitor;
a second capacitor;
a third capacitor; and
switches to alternately couple or decouple the first capacitor, second capacitor, and third capacitor at least partially responsive to the control signals for each of the first measurement process and the second measurement process.

15. The apparatus of claim 14, wherein the control signals for the first measurement process to control the voltage scaling circuit to:

couple the first capacitor and the voltage node to start charge of the first capacitor;

couple the second capacitor between two ground connections to start discharge of the second capacitor;

decouple the first capacitor from the voltage node and decouple an end of the second capacitor and one of the two ground connections to finish charge of the first capacitor and discharge of the second capacitor;

couple the first capacitor and the second capacitor to share the charge of the first capacitor with the second capacitor; and couple the input of the measurement circuit and an output of the voltage scaling circuit to generate a voltage level at the input of the measurement circuit proportional to the voltage level at the voltage node.

16. The apparatus of claim 14, wherein the control signals for the second measurement process to control the voltage scaling circuit to:

couple the second capacitor and the third capacitor;

couple the first capacitor and the voltage node to start charge of the first capacitor;

couple the coupled second and third capacitors between two ground connections to start discharge of the coupled second and third capacitors;

decouple the first capacitor from the voltage node and decouple an end of the coupled second and third capacitors from one of the two ground connections to finish charge of the first capacitor and discharge of the coupled second and third capacitors;

couple the first capacitor and the coupled second and third capacitors to share the charge of the first capacitor with the coupled second and third capacitors; and couple the input of the measurement circuit and an output of the voltage scaling circuit to generate a further voltage level at the input of the measurement circuit proportional to the voltage level at the voltage node.

17. The apparatus of claim 12, wherein the measurement circuit comprises a successive-approximation-register (SAR) analog-to-digital-converter (ADC).

18. The apparatus of claim 12, comprising an analog connection to couple the measurement circuit with the voltage scaling circuit.

19. An electronic system, comprising:

at least two successive-approximation-register (SAR) analog-to-digital-converters (ADCs);

a first scaling connection;

a second scaling connection;

a bus to route a voltage signal provided by the first and second scaling connection to either one of the at least two SAR ADCs; and a processor with a scaling factor that represents a relationship between a level of the voltage signal routed by the bus and a level of a voltage signal generated by a respective device coupled to a respective input of each of the first and second scaling connections, wherein respective devices coupled to the respective input of each of the first and second scaling connections each have a voltage domain that is higher than a voltage domain of the SAR ADCs.

* * * * *

UNITED STATES PATENT AND TRADEMARK OFFICE
CERTIFICATE OF CORRECTION

PATENT NO. : 12,174,227 B2
APPLICATION NO. : 17/653062
DATED : December 24, 2024
INVENTOR(S) : Lei Zou It is certified that error appears in the above-identified patent and that said Letters Patent is hereby corrected as shown below:

In the Specification

| | | |
|---|---|---|
| Column 6, | Line 9, | change "than $V_{Domain2}$ Voltage" to --than $V_{Domain2}$. Voltage-- |
| Column 8, | Line 15, | change "$I_{SW1}$—C1*$f_{S1}$," to --$I_{SW1}$ = C1*$f_{S1}$,-- |
| Column 8, | Line 15, | change "where $F_{S1}$ is the" to --where $f_{S1}$ is the-- |
| Column 10, | Line 61, | change "current LEAK, contributing" to --current $I_{LEAK}$, contributing-- |
| Column 11, | Line 43, | change "leakage LEAK at voltage" to --leakage $I_{LEAK}$ at voltage-- |

Signed and Sealed this
Twenty-fifth Day of February, 2025

Coke Morgan Stewart
*Acting Director of the United States Patent and Trademark Office*